(12) United States Patent
Shin et al.

(10) Patent No.: US 12,045,132 B2
(45) Date of Patent: Jul. 23, 2024

(54) NON-VOLATILE MEMORY DEVICE, CONTROLLER FOR CONTROLLING THE SAME, STORAGE DEVICE HAVING THE SAME, AND READING METHOD THEREOF

(71) Applicant: SAMSUNG ELECTRONICS CO., LTD., Suwon-si (KR)

(72) Inventors: Dongmin Shin, Seoul (KR); Jinyoung Kim, Seoul (KR); Sehwan Park, Yongin-si (KR); Youngdeok Seo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/156,893

(22) Filed: Jan. 19, 2023

(65) Prior Publication Data

US 2023/0153205 A1    May 18, 2023

Related U.S. Application Data

(62) Division of application No. 17/399,528, filed on Aug. 11, 2021, now Pat. No. 11,579,972.

(30) Foreign Application Priority Data

Jan. 14, 2021    (KR) .................. 10-2021-0005211

(51) Int. Cl.
*G06F 11/10* (2006.01)
*H03M 13/45* (2006.01)

(52) U.S. Cl.
CPC ......... *G06F 11/1068* (2013.01); *H03M 13/45* (2013.01)

(58) Field of Classification Search
CPC .......................... G06F 11/1068; H03M 13/45
See application file for complete search history.

(56) References Cited

U.S. PATENT DOCUMENTS

| | | | |
|---|---|---|---|
| 7,679,133 | B2 | 3/2010 | Son et al. |
| 8,234,545 | B2 | 7/2012 | Shalvi et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,190,160 | B2 | 11/2015 | Ok et al. |

(Continued)

OTHER PUBLICATIONS

Communication dated Mar. 11, 2022 issued by the European Patent Office in counterpart European Application No. 21196579.3.

*Primary Examiner* — Thien Nguyen
(74) *Attorney, Agent, or Firm* — Sughrue Mion, PLLC

(57) ABSTRACT

A controller including a non-volatile memory interface circuit connected to at least one non-volatile memory device and configured to control the at least one non-volatile memory device; an error correction circuit configured to perform an error correction operation on a codeword received from the non-volatile memory interface circuit according to an error correction decoding level from among a plurality of error correction decoding levels, wherein the non-volatile memory interface circuit is further configured to: receive side information from the at least one non-volatile memory device; predict a distribution of memory cells based on the side information; and select the error correction decoding level from among the plurality of error correction decoding levels according to the predicted distribution.

17 Claims, 26 Drawing Sheets

(56) References Cited

U.S. PATENT DOCUMENTS

| | | |
|---|---|---|
| 9,536,970 B2 | 1/2017 | Seol et al. |
| 10,120,589 B2 | 11/2018 | Jung |
| 10,152,380 B2 | 12/2018 | Yim et al. |
| 10,320,429 B2 | 6/2019 | Sakurada |
| 10,373,693 B2 | 8/2019 | Cha et al. |
| 10,521,291 B2 | 12/2019 | Ha et al. |
| 10,691,346 B2 | 6/2020 | Han |
| 10,691,535 B2 | 6/2020 | Zeng et al. |
| 2015/0043276 A1 | 2/2015 | Sharon et al. |
| 2015/0229337 A1 | 8/2015 | Alhussien et al. |
| 2015/0303948 A1 | 10/2015 | Yoon et al. |
| 2016/0004437 A1* | 1/2016 | Kim .................. G11C 29/021 |
| | | 714/764 |
| 2016/0266969 A1 | 9/2016 | Jeon |
| 2016/0350179 A1 | 12/2016 | Lin et al. |
| 2017/0235633 A1 | 8/2017 | Park |
| 2017/0308433 A1 | 10/2017 | Kwon et al. |
| 2017/0345510 A1 | 11/2017 | Achtenberg et al. |
| 2018/0210786 A1 | 7/2018 | Kim |
| 2020/0159464 A1* | 5/2020 | Park .................. H03M 13/1111 |
| 2021/0184699 A1 | 6/2021 | Kwak et al. |

\* cited by examiner

NON-VOLATILE MEMORY DEVICE, CONTROLLER FOR CONTROLLING THE SAME, STORAGE DEVICE HAVING THE SAME, AND READING METHOD THEREOF

CROSS TO REFERENCE TO RELATED APPLICATION(S)

This is a Divisional of U.S. application Ser. No. 17/399,528 filed Aug. 11, 2021, which is based on and claims priority under 35 U.S.C. § 119 to Korean Patent Application No. 10-2021-0005211 filed on Jan. 14, 2021 in the Korean Intellectual Property Office, the disclosure of which is incorporated by reference herein in its entirety.

BACKGROUND

1. Field

The disclosure relate to a non-volatile memory device, a controller for controlling the same, a storage device having the same, and a reading method thereof.

2. Description of Related Art

Generally, a storage device may generate an error correction code using an error correction code (ECC) circuit in a write operation, and the storage device may correct an error in data by referring to the error correction code in a read operation. However, it may be impossible to perform the correction using an ECC circuit when the degree of deterioration of the memory cells is severe. In this case, a read retry operation using a sensing technique different from that of a normal read operation may be performed.

SUMMARY

Provided is a non-volatile memory device which may reduce a latency of a defense code, a controller for controlling the same, a storage device having the same, and a reading method thereof.

Additional aspects will be set forth in part in the description which follows and, in part, will be apparent from the description, or may be learned by practice of the presented embodiments.

In accordance with an aspect of the disclosure a controller includes a non-volatile memory interface circuit connected to at least one non-volatile memory device and configured to control the at least one non-volatile memory device; an error correction circuit configured to perform an error correction operation on a codeword received from the non-volatile memory interface circuit according to an error correction decoding level from among a plurality of error correction decoding levels, wherein the non-volatile memory interface circuit is further configured to: receive side information from the at least one non-volatile memory device; predict a distribution of memory cells based on the side information; and select the error correction decoding level from among the plurality of error correction decoding levels according to the predicted distribution.

In accordance with an aspect of the disclosure, an operation method of a controller includes receiving side information from at least one non-volatile memory device through at least one pin; determining an error correction decoding level from among a plurality of error correction decoding levels based on the side information; and performing an error correction operation according to the determined error correction decoding level.

In accordance with an aspect of the disclosure, a non-volatile memory device includes a plurality of memory blocks including at least two strings between respective bitlines and a common source line, wherein each string of the at least two strings includes at least one string selection transistor, a plurality of memory cells, and at least one ground transistor connected in series between a bitline of the bitlines and the common source line, wherein a gate of the at least one string selection transistor is connected to a string selection line, wherein each memory cell of the plurality of memory cells is configured to receive a wordline voltage from a corresponding wordline, and wherein a gate of the at least one ground transistor is connected to a ground selection line; and a control logic configured to perform at least one on-chip valley search (OVS) read operation with respect to memory cells connected to a wordline of a memory block selected from among the plurality of memory blocks based on a first read command, and to output detection information of the at least one OVS read operation to an external device based on a specific command, wherein the detection information includes information about whether a search for an optimal valley is successful, or about a height value of the optimal valley.

In accordance with an aspect of the disclosure, a storage device includes at least one non-volatile memory device; and a controller configured to control the at least one non-volatile memory device, and including: control pins configured to provide control signals to the at least one non-volatile memory device; a buffer memory configured to store tables for executing a plurality of defense codes; an error correction circuit configured to correct an error of first read data of a first page read from the at least one non-volatile memory device based on a first read command; and at least one processor configured to drive a defense code management unit based on an error of the first read data being uncorrectable, wherein the defense code management unit is configured to: receive side information from the at least one non-volatile memory device through at least one control pin of the control pins, and select a defense code of the plurality of defense codes, or a defense code flow from among a plurality of defense code flows, based on the side information.

In accordance with an aspect of the disclosure, a reading method of a storage device includes performing a normal read operation based on a default read level; determining whether data read in the normal read operation is error-correctable; performing an on-chip valley search (OVS) read operation based on determining that the read data is not error-correctable; and performing an adaptive defense code according to detection information of the OVS read operation based on a result of the OVS read operation being a read-failure, wherein the adaptive defense code corresponds to one of a hard decision read operation, a soft decision read operation, and a valley search read operation according to the detection information.

In accordance with an aspect of the disclosure, a non-volatile memory device includes a memory cell area having a first metal pad; a peripheral circuit area having a second metal pad and being vertically connected through the first metal pad and the second metal pad; a memory cell array including a plurality of memory blocks having a plurality of memory cells connected to a plurality of wordlines and a plurality of bitlines in the memory cell area; a row decoder configured to select one of the plurality of wordlines in the peripheral circuit area; a page buffer circuit having a plurality of page buffers connected to the plurality of bitlines in the peripheral circuit area; and a control logic configured to receive a command latch enable (CLE) signal, an address latch enable (ALE) signal, a chip enable signal, a write enable (WE) signal, a read enable signal, and a data strobe signal through control pins, and to perform an on-chip valley search (OVS) read operation by latching a command or an address on an edge of the WE signal in response to the CLE signal and the ALE signal, in the peripheral circuit area, wherein the control logic is configured to output detection information of the OVS read operation to an external device based on a specific command, and wherein the detection information includes information about whether a search for an optimal valley is successful, or about a valley height value of the optimal valley. In accordance with an aspect of the disclosure, a method of controlling a storage device includes performing a read operation to obtain read data; detecting an error in the read data; determining whether the error in the read data is correctable; based on determining that the error in the read data is not correctable, performing an on-chip valley search (OVS) read operation; obtaining detection information corresponding to the OVS read operation; selecting a data recovery procedure from among a plurality of data recovery procedures based on the detection information; and performing the selected data recovery procedure.

BRIEF DESCRIPTION OF DRAWINGS

The above and other aspects, features, and advantages of certain embodiments of the present disclosure will be more apparent from the following description, taken in conjunction with the accompanying drawings, in which.

DETAILED DESCRIPTION

Figure 1:
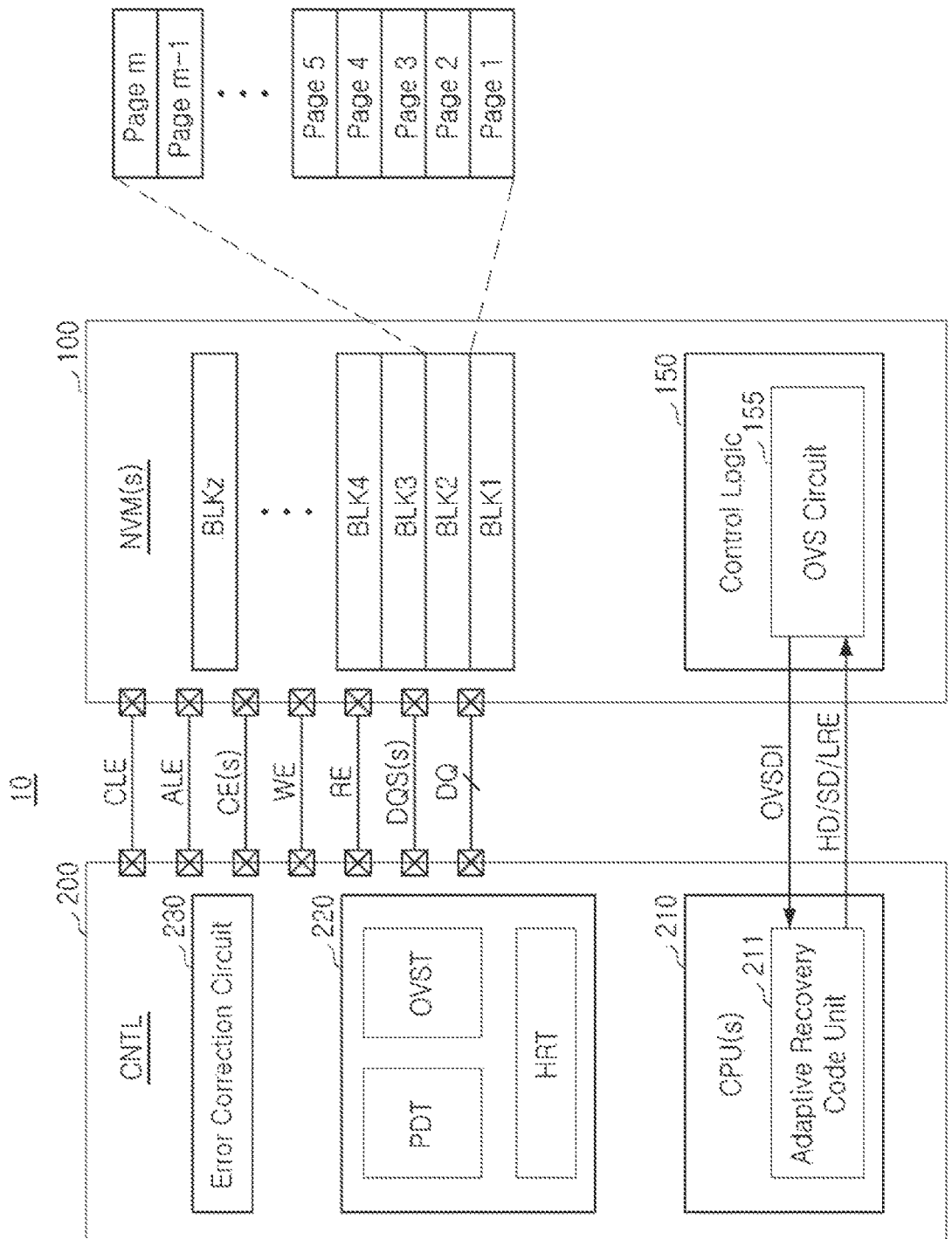
FIG. 1 is a diagram illustrating a storage device 10 according to an embodiment.

Hereinafter, embodiments of the present disclosure will be described as follows with reference to the accompanying drawings.

As is traditional in the field, embodiments may be described and illustrated in terms of blocks which carry out a described function or functions. These blocks, which may be referred to herein as units or modules or the like, or by names such as driver, controller, device, or the like, may be physically implemented by analog or digital circuits such as logic gates, integrated circuits, microprocessors, microcontrollers, memory circuits, passive electronic components, active electronic components, optical components, hardwired circuits, or the like, and may be driven by firmware and software. The circuits may, for example, be embodied in one or more semiconductor chips, or on substrate supports such as printed circuit boards and the like. Circuits included in a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks. Likewise, the blocks of the embodiments may be physically combined into more complex blocks.

Generally, NAND flash memory-based solution products such as a solid state drive (SSD) or a universal flash storage (UFS) may include various techniques which may extend a lifespan of a product by delaying deterioration of the NAND flash memory caused by user usage, and the techniques may be collectively referred to as a defense code. The deterioration of the NAND flash memory may be caused by process fragmentation and various external environmental factors. The deterioration of the NAND flash memory may increase the number of errors in read data, which may cause a difficulty in data recovery by an error correction code (ECC), such that reliability of the product may degrade. The defense code may contribute to data recovery of the ECC by inhibiting an increase of errors caused by deterioration of the NAND flash memory The term "defense code" may also refer to a software recovery algorithm in a narrow sense. The defense code may be implemented through firmware in a solution. Also, the term "defense code" may also refer to an algorithm for improving characteristics within a single NAND flash memory unit, and an ECC hardware IP within a controller in a broader sense. In the description below, the term "defense code" may be used to refer to a software recovery algorithm defined in a narrower sense, although the disclosure is not limited thereto.

Generally, a defense code algorithm for preventing deterioration of the NAND flash memory may be largely divided into a prevention technique and a recovery technique. The prevention technique may preemptively protect the NAND flash memory from deterioration, and may include a garbage collection, for example block management, wear leveling, for example pursuing uniform deterioration, and read reclaim, for example predicting the degree of deterioration in advance and preventing defects in advance by transcribing the degree. The technique of extending lifespan using a variable parameter according to a program-erase (PE) cycle may also be classified into a prevention defense code in a broader range.

The recovery defense code may refer to all techniques which, when the ECC circuit fails to correct errors, for example when an excessive number of errors are present, may reduce errors to correct the errors or may allow the ECC circuit to correct errors. A representative recovery defense code may be a technique of reducing the number of errors by moving a read level to an optimal position when the number of errors increases due to an incorrect read level.

Also, there may be various methods for finding a read level having the least number of distribution errors. Generally, there may be a method of swiftly finding an optimal read level by sacrificing accuracy, and a method of finding the most accurate read level by making a considerable effort. A pre-defined table (PDT) may be a representative example of the former. The defense code using the PDT may continue to make an attempt until an error is corrected by the ECC circuit using predetermined read level sets. Although read level accuracy is not 100%, the attempts may be made multiple times swiftly, such that the defense code may be deployed in an early stage.

Also, differently from the table approach method, there may be an algorithm for finding an optimal valley using a mathematical algorithm by estimating a shape near a valley of distribution. For example, a less read estimation (LRE) defense may fall into this method. Because many resources may be used to find a valley, the algorithm may be strategically deployed in a late stage of the defense code.

Also, advanced ECC circuits, which may for example use a low density parity check (LDPC) code, may maximize error correction ability using information of whether read data is '0' or '1', and also information about whether the information is reliable. Generally, a hard-decision read may be a reading method of extracting information of whether data is '0' or '1' by reading the area near the valley only once. Also, a soft decision read may be a reading method of additionally extracting information of how much the 0/1 information is reliable by reading the area near the valley several times using different read levels.

Generally, performing ECC decoding, or correction, using only a hard decision read result may be referred to as HD decoding, and ECC decoding also using a soft decision read result may be referred to as SD decoding. The correction ability of soft decision decoding may be much better than that of the hard decision decoding. However, because the soft-decision read has a larger number of reads, the soft-decision read may cause a burden on product performance. Therefore, basically, the hard decision decoding may performed first by performing the hard decision read, and when the hard decision decoding fails, the soft decision read having more powerful correction ability may be performed, and the soft decision decoding may be performed, which may be effective.

The hard decision decoding may fail because the read level is found incorrectly. When the hard decision decoding fails even though the read level is found correctly, it may be effective to perform the soft decision read/decoding. When errors increase by finding the read level incorrectly, it may be more efficient to perform the hard decision decoding after finding the read level swiftly again.

As for a non-volatile memory device in an example embodiment, a controller for controlling the same, a storage device having the same, and a reading method thereof, when an error is not correctable in a default read, an operation of searching for an optimal valley of the non-volatile memory device may be performed, read data and optimal valley detection information, for example an indication of whether optimal valley search is successful, or an optimum valley height, may be transferred to the controller, and an optimal defense code may be selected or an optimal defense code flow may be selected using the optimal valley detection information. In other words, the controller may determine an error level or a distribution shape of the read data using the read data and the received detection information, and may select an optimal defense code or an optimal defense code flow. For example, the controller may select a basic defense code flow when it is determined that the read data is normal, and the controller may select the defense code flow which may directly enter the soft decision read/decoding rather than the hard decision when it is determined that the number of errors is high. Also, when it is determined that the read level is incorrect, the controller may select a defense code flow which may send a re-read request to the NAND flash memory without performing the ECC decoding.

As for the non-volatile memory device, the controller for controlling the same, the storage device having the same, and the reading method thereof in an example embodiment, by performing the defense code operation according to the optimal defense code or the optimal defense code flow using the detection information according to the optimal valley searching operation, reliability of the read operation may be swiftly secured.

FIG. 1 is a diagram illustrating a storage device 10 according to an example embodiment. Referring to FIG. 1, the storage device 10 may include at least one non-volatile memory device 100 (NVM) and a controller 200 (CNTL).

The at least one non-volatile memory device 100 may be implemented to store data. The non-volatile memory device 100 may be implemented as a NAND flash memory, a vertical NAND flash memory, a NOR flash memory, a resistive random access memory (RRAM), and a phase-change memory (PRAM), a magnetoresistive random access memory (MRAM), a ferroelectric random access memory (FRAM), a spin transfer torque random access memory (STT-RAM), and the like. Also, the non-volatile memory device 100 may be implemented in a three-dimensional array structure. The example embodiment may be applicable to a flash memory device in which a charge storage layer is formed of a conductive floating gate, and also to a charge trap flash (CTF) in which the charge storage layer is formed of an insulating layer. In the description below, the non-volatile memory device 100 may be implemented as a vertical NAND flash memory device (VNAND) for ease of description.

Also, the non-volatile memory device 100 may be implemented to include a plurality of memory blocks BLK1-BLKz (where z is an integer equal to or greater than 2) and a control logic 150. Each of the plurality of memory blocks BLK1-BLKz may include a plurality of pages Page 1-Page m (where m is an integer equal to or greater than 2). Each of the plurality of pages Page 1-Page m may include a plurality of memory cells. Each of the plurality of memory cells may store at least one bit.

The control logic 150 may receive a command and an address from the controller 200, and may perform an operation, for example a program operation, a read operation, an erase operation, or the like, corresponding to the received command on the memory cells corresponding to the address.

Also, the control logic 150 may include an OVS circuit 155. The OVS circuit 155 may be implemented to perform an on-chip valley search (OVS) operation. Generally, the OVS operation may include an operation of acquiring a cell count according to various develop times, an operation of determining an OVS detection case based on the acquired cell count, and a main sensing operation of sensing by changing an actual develop time according to the determined OVS detection case. The OVS circuit 155 may be implemented to store detection information (OVSDI), which may be for example detection case information, or cell count information, corresponding to a result of the OVS operation. The detection information OVSDI may include information, for exmaple develop time information, indicating an optimal distribution valley corresponding to a state.

The controller 200 may be connected to at least one non-volatile memory device 100 through a plurality of control pins for transmitting control signals, for example CLE, ALE, CE(s), WE, RE, or the like, and may also be implemented to control the non-volatile memory device 100 using the control signals. For example, the non-volatile memory device 100 may perform a program operation/read operation/erasing operation by latching a command (CMD) or an address (ADD) on an edge of a write enable (WE) signal according to a command latch enable (CLE) signal and an address latch enable (ALE) signal.

Also, the controller 200 may include at least one processor, for example central processing unit (CPU) 210, a buffer memory 220, and an error correction circuit 230, which may be for example an ECC circuit.

The CPU 210 may be implemented to control overall operation of the storage device 10. The CPU 210 may perform various management operations such as cache/buffer management, firmware management, garbage collection management, wear leveling management, data duplication removal management, read refresh/reclaim management, bad block management, multi-stream management, mapping of host data and non-volatile memory management, quality of service (QoS) management, system resource allocation management, non-volatile memory queue management, read level management, erase/program management, hot/cold data management, power loss protection management, dynamic thermal management, initialization management, redundant array of inexpensive disk (RAID) management.

Also, the CPU 210 may be implemented to drive an adaptive defense code unit 211. The adaptive defense code unit 211 may select an optimal defense code or may select an optimal defense code series using detection information OVSDI according to the OVS operation. In an example embodiment, the adaptive defense code unit 211 may be implemented in firmware or software, or any combination thereof.

In an example embodiment, the adaptive defense code unit 211 may select one of a performance reliability defense code, a life reliability defense code, and a machine learning defense code using the detection information OVSDI. The reliability defense code may include a temperature compensation defense code, an address compensation defense code, a history defense code, an on-chip valley search (OVS) defense code, an RPF, a pre-defined table (PDT) defense code, and the like. Also, the lifetime defense code may include Least Read Estimation (LRE), DRR, SWING, and soft decision offset tracking (SDOT).

In another example embodiment, the adaptive defense code unit 211 may select a defense code series using the detection information OVSDI. The defense code series may refer to a continuous operation of at least two different defense codes.

The adaptive defense code unit 211 illustrated in FIG. 1 may be performed in the controller 200. However, an example embodiment thereof is not limited thereto. The adaptive defense code unit may also be executed in the non-volatile memory device 100.

The buffer memory 220 may be implemented as a volatile memory, for example static random access memory (SRAM), dynamic RAM (DRAM), synchronous RAM (SDRAM), or the like, or a non-volatile memory, for example a flash memory, PRAM, MRAM, resistive RAM (ReRAM), FRAM, or the like. The buffer memory 220 may include at least one pre-defined table (PDT), OVS table (OVST), and history read level table (HRT).

The PDT may include first read level offset information. In an example embodiment, the PDT may include first read level offset information corresponding to the program elapsed time. In an example embodiment, the PDT may include first read level offset information corresponding to various deterioration information, for example temperature, program/erase cycle, read cycle, open wordline case, wordline position information, or the like, in addition to the program elapsed time.

The OVST may include second read level offset information corresponding to the detection information OVSDI. Here, the detection information OVSDI may be configured as develop time information corresponding to an optimal distribution valley. In other words, the second read level offset information may include read level offset information corresponding to develop time information in which the OVS operation is performed. Accordingly, the OVST may be a table obtained by converting the detection information OVSDI to the read level offset information.

The HRT may include third read level offset information related to a history read operation. In an example embodiment, the third read level offset information may include information obtained by accumulating the second read level offset information. In another example embodiment, the third read level offset information may be determined using the first read level offset information and the second read level offset information. The third read level offset information may include an optimal read level for performing a history read operation. Examples of a history read operation are described in U.S. Pat. Nos. 10,120,589, and 10,373,693, the disclosures of which are incorporated by reference herein in their entirety.

The error correction circuit 230 may be implemented to generate an error correction code during a program operation and to recover data using the error correction code during a read operation. In other words, the error correction circuit 230 may generate an error correction code for correcting a fail bit or an error bit of the data received from the non-volatile memory device 100. The error correction circuit 230 may form data to which a parity bit is added by performing error correction encoding of data provided to the non-volatile memory device 100. The parity bit may be stored in the non-volatile memory device 100.

Also, the error correction circuit 230 may perform error correction decoding on the data output by the non-volatile memory device 100. The error correction circuit 230 may correct an error using parity. The error correction circuit 230 may correct an error using an LDPC code, a BCH code, a turbo code, a Reed-Solomon code, a convolution code, a recursive systematic code (RSC), and coded modulation such as trellis-coded modulation (TCM) and block coded modulation (BCM).

When error correction is impossible in the error correction circuit 230, a read retry operation may be performed. In an example embodiment, the read retry operation may include the OVS operation.

The storage device 10 in an example embodiment may include an adaptive defense code unit 211 which may select/perform an optimal defense code or an optimal defense code series using the detection information OVSDI according to the OVS operation after an uncorrectable error correction code (UECC) is generated, such that performance improvement such as reduction of a latency of the ECC decoder and the defense code may be expected.

Figure 2:
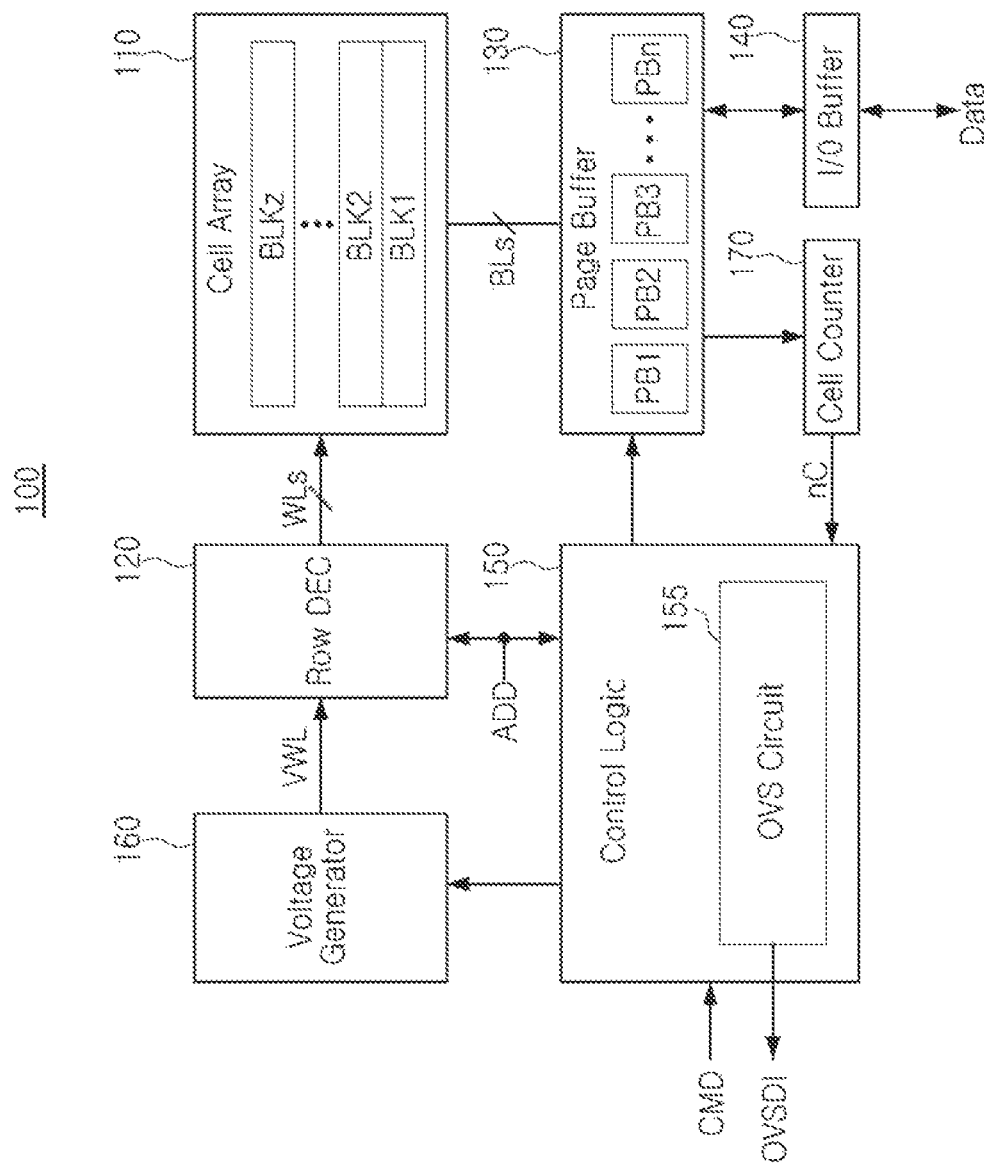
FIG. 2 is a diagram illustrating a non-volatile memory device 100 illustrated in FIG. 1, according to an embodiment.

FIG. 2 is a diagram illustrating a non-volatile memory device 100 illustrated in FIG. 1. Referring to FIG. 2, the non-volatile memory device 100 may include a memory cell array 110, a row decoder 120 (Row DEC), a page buffer circuit 130, an input/output buffer circuit 140, a control logic 150, a voltage generator 160, and a cell counter 170.

The memory cell array 110 may be connected to the row decoder 120 through wordlines WLs or selection lines SSL and GSL. The memory cell array 110 may be connected to the page buffer circuit 130 through bitlines BLs. The memory cell array 110 may include a plurality of cell strings. Each channel of the cell strings may be formed in a vertical or horizontal direction. Each of the cell strings may include a plurality of memory cells. The plurality of memory cells may be programmed, erased, or read by a voltage provided to the bitlines BLs or the wordlines WLs. Generally, a program operation may be performed by a page unit, and an erase operation may be performed by a block unit. Examples of such memory cells are described in greater detail in U.S. Pat. Nos. 7,679,133, 8,553,466, 8,654,587, 8,559,235, and 9,536,970, the disclosures of which are incorporated by reference herein in their entirety. In an example embodiment, the memory cell array 330 may include a two-dimensional memory cell array, and the two-dimensional memory cell array may include a plurality of NAND strings arranged in a row direction and a column direction.

The row decoder 120 may be implemented to select one of the memory blocks BLK1-BLKz of the memory cell array 110 in response to an address ADD. The row decoder 120 may select one of the wordlines of the selected memory block in response to the address ADD. The row decoder 120 may transfer a wordline voltage VWL corresponding to an operation mode to the wordline of the selected memory block. During the program operation, the row decoder 120 may apply a program voltage and a verify voltage to the selected wordline, and may apply a pass voltage to the non-selected wordline. During a read operation, the row decoder 120 may apply a read voltage to a selected wordline and a read pass voltage to an unselected wordline.

The page buffer circuit 130 may be implemented to operate as a write driver or a sense amplifier. During the program operation, the page buffer circuit 130 may apply a bitline voltage corresponding to data to be programmed to the bitlines of the memory cell array 110. During a read operation or a verify read operation, the page buffer circuit 130 may detect data stored in the selected memory cell through the bitline BL. Each of the plurality of page buffers PB1-PBn (wherein n is an integer equal to or greater than 2) included in the page buffer circuit 130 may be connected to at least one bitline.

Each of the plurality of page buffers PB1-PBn may be implemented to perform sensing and latching for performing the OVS operation. In other words, each of the plurality of page buffers PB1-PBn may perform a plurality of sensing operations to identify one of states stored in the selected memory cells under the control of the control logic 150. Also, each of the plurality of page buffers PB1-PBn may store each data sensed through a plurality of sensing operations, and may select one of data under the control of the control logic 150. In other words, each of the plurality of page buffers PB1-PBn may perform sensing a plurality of times to identify one of the states. Also, each of the plurality of page buffers PB1-PBn may select or output optimal data from among a plurality of pieces of data sensed under the control of the control logic 150.

The input/output buffer circuit 140 may provide data provided from an external entity to the page buffer circuit 130. The input/output buffer circuit 140 may provide a command CMD provided from an external entity to the control logic 150. The input/output buffer circuit 140 may provide an address ADD provided from an external entity to the control logic 150 or the row decoder 120. Also, the input/output buffer circuit 140 may output data sensed and latched by the page buffer circuit 130 to an external entity.

The control logic 150 may be implemented to control the row decoder 120 and the page buffer circuit 130 in response to a command CMD transmitted from an external entity. Further, the control logic 150 may include an OVS circuit 155 to perform the OVS operation.

The OVS circuit 155 may control the page buffer circuit 130 and the voltage generator 160 for the OVS operation. The OVS circuit 155 may control the page buffer circuit 130 to perform a plurality of sensing operations to identify specific states of the selected memory cells. Also, the OVS circuit 155 may control the plurality of page buffers PB1-PBn to store the sensed data corresponding to each of the plurality of sensing results in a plurality of latch sets provided in each of the plurality of page buffers PB1-PBn. Also, the OVS circuit 155 may perform processing for selecting optimal data from among the plurality of sensed data. To select optimal data, the OVS circuit 155 may refer to a count result nC provided from the cell counter 170. In other words, the OVS circuit 155 may control the page buffer circuit 130 to select and output a read result closest to the distribution valley from among the plurality of sensing results.

Also, the OVS circuit 155 may store develop time information corresponding to the OVS operation. The OVS circuit 155 may output the stored develop time information to the controller 200 as the detection information OVSDI. In an example embodiment, the detection information OVSDI may be output using UM out or may be output in response to a specific command, for example a get feature command, a status read command, or the like.

The voltage generator 160 may be implemented to generate various types of wordline voltages to be applied to respective wordlines and a well voltage to be supplied to a bulk, for example a well region. in which the memory cells are formed, under the control of the control logic 150. The wordline voltages applied to the respective wordlines may include a program voltage, a pass voltage, a read voltage, a read pass voltage, and the like.

The cell counter 170 may be implemented to count memory cells corresponding to a specific threshold voltage range from data sensed by the page buffer circuit 130. For example, the cell counter 170 may count the number of memory cells having a threshold voltage within a specific threshold voltage range by processing the data sensed in each of the plurality of page buffers PB1-PBn.

Figure 3:
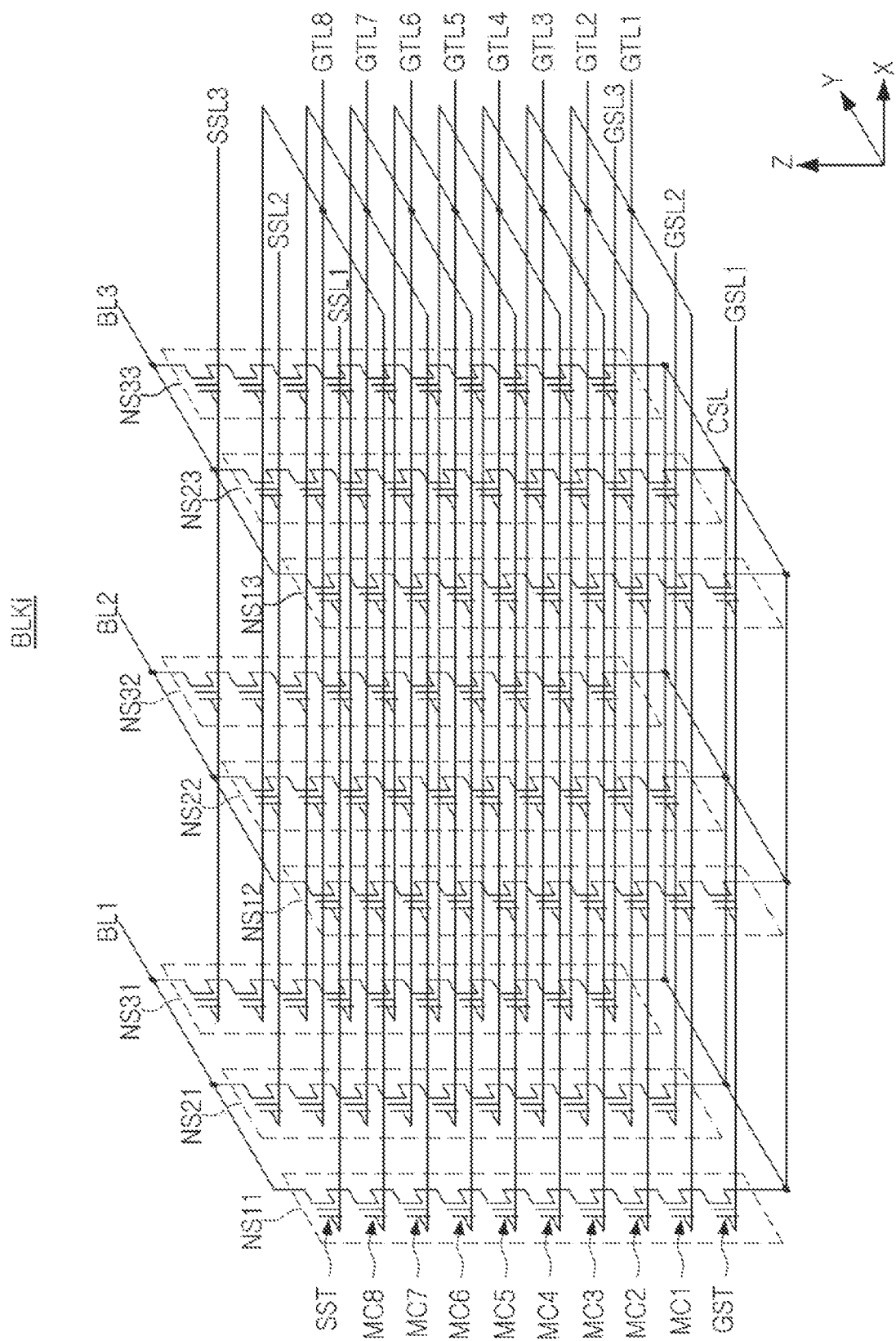
FIG. 3 is a diagram illustrating a circuit diagram illustrating one memory block BLKi among memory blocks illustrated in FIG. 1, according to an embodiment.

FIG. 3 is a diagram illustrating a circuit diagram illustrating a memory block BLKi (where i is an integer equal to or greater than 2). A plurality of memory NAND strings included in the memory block BLKi may be formed in a direction perpendicular to the substrate.

Referring to FIG. 3, a memory block BLKi may include a plurality of memory NAND strings NS11-NS33 connected between bitlines BL1, BL2, and BL3 and a common source line CSL. Each of the plurality of memory NAND strings NS11-NS33 may include a string selection transistor SST, a plurality of memory cells MC1, MC2, . . . , MC8, and a ground selection transistor GST. In FIG. 3, each of the plurality of memory NAND strings NS11-NS33 may include eight memory cells MC1, MC2, . . . , MC8, but an example embodiment thereof is not limited thereto.

The string selection transistor SST may be connected to corresponding string selection lines SSL1, SSL2, and SSL3. The plurality of memory cells MC1, MC2, . . . , MC8 may be connected to corresponding gate lines GTL1, GTL2, GTL8, respectively. The gate lines GTL1, GTL2, GTL8 may be wordlines, and a portion of the gate lines GTL1, GTL2, GTL8 may be dummy wordlines. The ground selection transistor GST may be connected to corresponding ground selection lines GSL1, GSL2, and GSL3. The string selection transistor SST may be connected to corresponding bitlines BL1, BL2, and BL3, and the ground selection transistor GST may be connected to the common source line CSL.

Wordlines, for example wordline WL1, having the same height may be connected in common, and ground selection lines GSL1, GSL2, and GSL3 may be separated from string selection lines SSL1, SSL2, and SSL3, respectively. In FIG. 3, the memory block BLK may be connected to the eight gate lines GTL1, GTL2, GTL8, but embodiments are not limited thereto.

Figure 4:
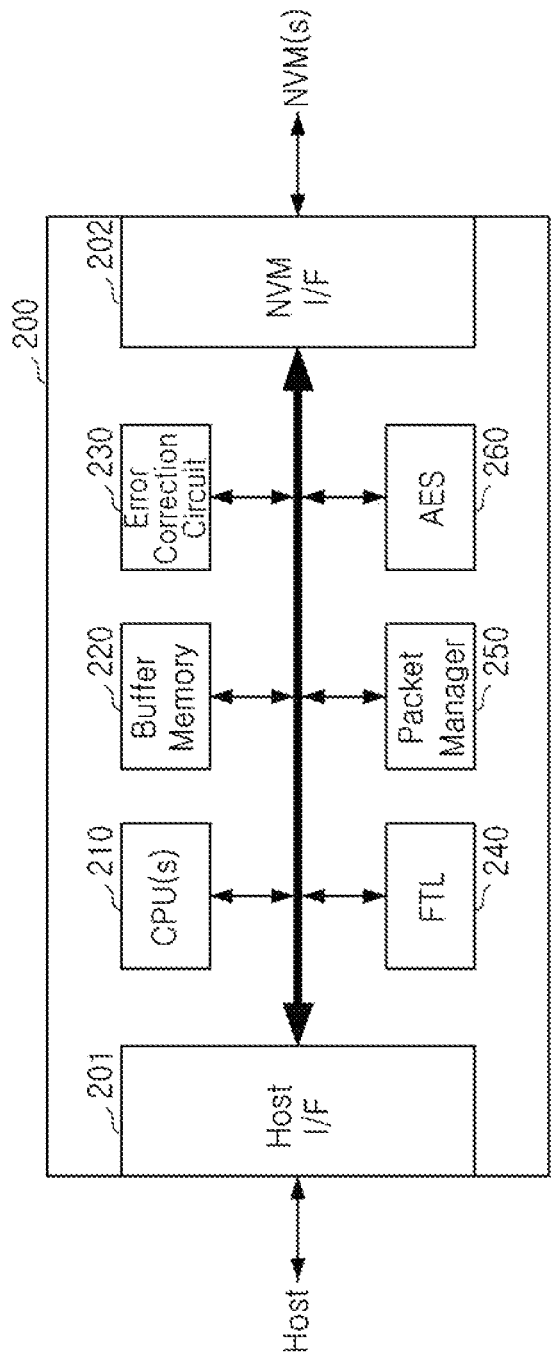
FIG. 4 is a diagram illustrating a controller 200 according to an embodiment.

FIG. 4 is a diagram illustrating a controller 200 according to an example embodiment. Referring to FIG. 4, the controller 200 may include a host interface 201, a memory interface 202 (NVM I/F), at least one CPU 210, a buffer memory 220, an error correction circuit 230, and a flash translation layer manager 240 (FTL), which may be for example a flash conversion layer manager, a packet manager 250, and an encryption device 260 (AES).

The host interface 201 may be implemented to transmit a packet to, and receive a packet from, a host. A packet transmitted from the host to the host interface 201 may include a command or data to be written in the non-volatile memory device 100. A packet transmitted from the host interface 201 to the host may include a response to a command or data read from the non-volatile memory device 100. The memory interface 202 may transmit data to be written in the non-volatile memory device 100 to the non-volatile memory device 100 or may receive data read from the non-volatile memory device 100. The memory interface 202 may be implemented to comply with standards such as Joint Electron Device Engineering Council (JEDEC) Toggle or Open NAND Flash Interface (ONFI) standards.

The flash translation layer manager 240 may perform various functions such as address mapping, wear-leveling, and garbage collection. The address mapping operation may be an operation of converting a logical address received from a host into a physical address used to actually store data in the non-volatile memory device 100. The wear-leveling may be a technique for preventing excessive deterioration of a specific block by allowing blocks in the non-volatile memory device 100 to be used evenly. For example, the wear-leveling may be implemented through a firmware technique for balancing erase counts of physical blocks. The garbage collection may be a technique for securing usable capacity in the non-volatile memory device 100 by copying valid data of a block to a new block and erasing an existing block.

The packet manager 250 may generate a packet according to a protocol of an interface negotiated with a host, or may parse various information from a packet received from the host. Also, the buffer memory 220 may temporarily store data to be written to the non-volatile memory device 100 or data read from the non-volatile memory device 100. In an example embodiment, the buffer memory 220 may be included in the controller 200. In another example embodiment, the buffer memory 220 may be disposed externally from the controller 200.

The encryption device 260 may perform at least one of an encryption operation and a decryption operation for data input to the CPU 210 using a symmetric-key algorithm. The encryption device 260 may encrypt and decrypt data using an advanced encryption standard (AES) algorithm. The encryption device 260 may include an encryption module and a decryption module.

Figure 5A:
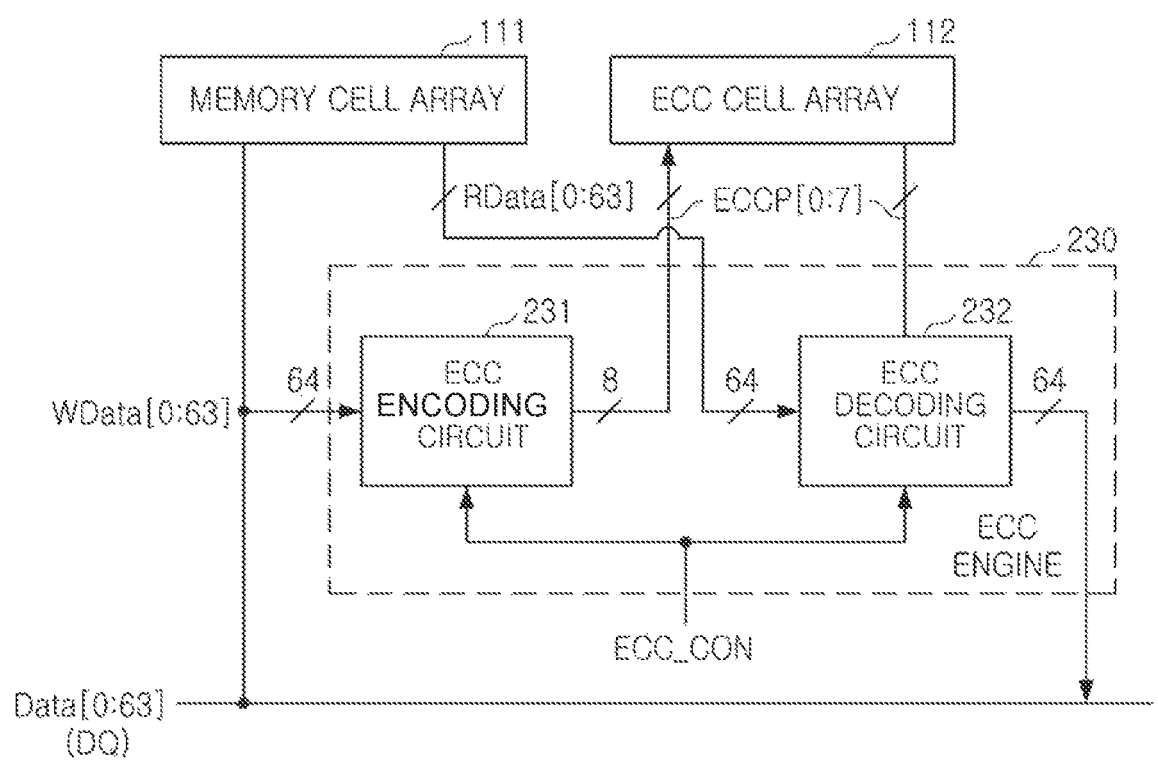
FIGS. 5A, 5B, and 5C are diagrams illustrating an error correction circuit 230 of a controller 200 according to an embodiment.
Figure 5B:
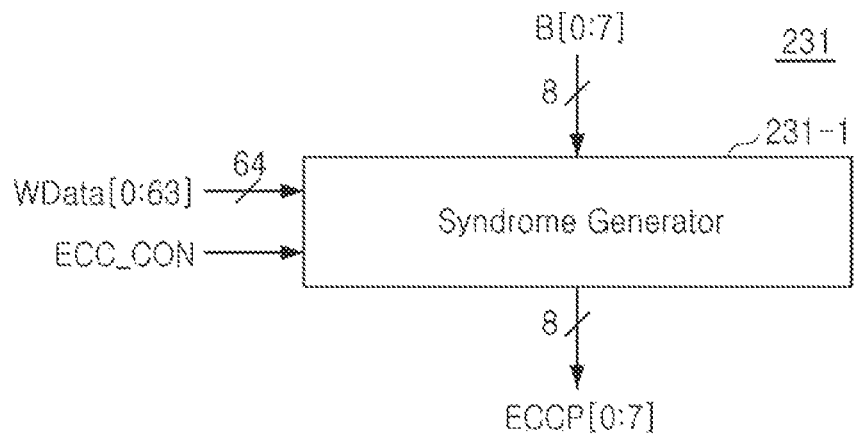
Figure 5C:
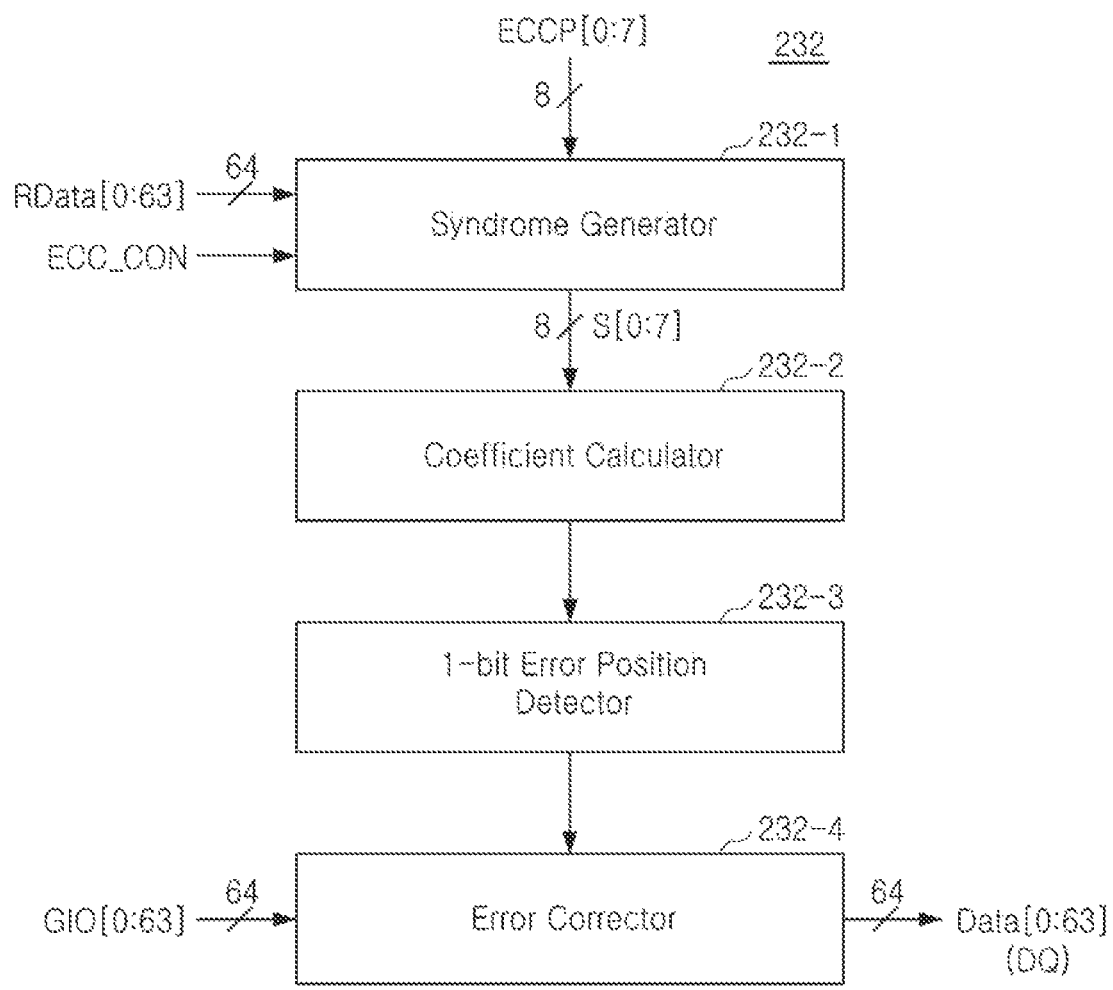

FIGS. 5A, 5B, and 5C are diagrams illustrating an error correction circuit 230 of a controller 200 according to an example embodiment.

Referring to FIG. 5A, the error correction circuit 230 may include an ECC encoding circuit 231 and an ECC decoding circuit 232. The ECC encoding circuit 231 may generate parity bits ECCP[0:7] for data WData[0:63] to be written in memory cells of a memory cell array 111 in response to an ECC control signal ECC_CON. The parity bits ECCP[0:7] may be stored in the ECC cell array 112. In an example embodiment, the ECC encoding circuit 231 generate parity bits ECCP[0:7] for data WData[0:63] to be written in memory cells including defective cells in response to the ECC control signal ECC_CON.

The ECC decoding circuit 232 may correct error bit data using data RData[0:63] read from the memory cells of the memory cell array 111 and parity bits ECCP[0:7] read from the ECC cell array 112, in response to the ECC control signal ECC_CON, and may output error-corrected data[0:63]. In an example embodiment, the ECC decoding circuit 232 may correct error bit data using data RData[0:63] read from the memory cells including defective cells and parity bits ECCP[0:7] read from the ECC cell array 112, in response to the ECC control signal ECC_CON, and may output error-corrected data[0:63].

Referring to FIG. 5B, the ECC encoding circuit 231 may include a syndrome generator 231-1 configured to receive 64-bit write data WData[0:63] and a basis bit B[0:7] in response to the ECC control signal ECC_CON and to generate parity bits ECCP[0:7], that is, a syndrome, using an XOR array computation. The basis bits B[0:7] may be bits for generating parity bits ECCP[0:7] for 64-bit write data WData[0:63], and may include b'00000000 bits, for example. The basis bit B[0:7] may use other bits instead of b'00000000 bits.

Referring to FIG. 5C, the ECC decoding circuit 232 may include a syndrome generator 232-1, a coefficient calculator 232-2, a 1-bit error position detector 232-3, and an error corrector 232-4. The syndrome generator 232-1 may receive 64-bit read data and 8-bit parity bits ECCP[0:7] in response to the ECC control signal ECC_CON, and may generate syndrome data (S[0:7] using the XOR array computation. The coefficient calculator 232-2 may calculate a coefficient of an error position equation using syndrome data S[0:7]. In the error position equation, a reciprocal of the error bit may be a root. The 1-bit error position detector 232-3 may calculate a position of a 1-bit error using the calculated error position equation. The error corrector 232-4 may determine a 1-bit error position based on a detection result of the 1-bit error position detector 232-3. The error corrector 232-4 may correct an error by inverting a logic value of the bit in which an error occurred in 64-bit read data RData[0:63] according to the determined 1-bit error position information, and may output the error-corrected 64-bit read data RData[0:63].

Figure 6:
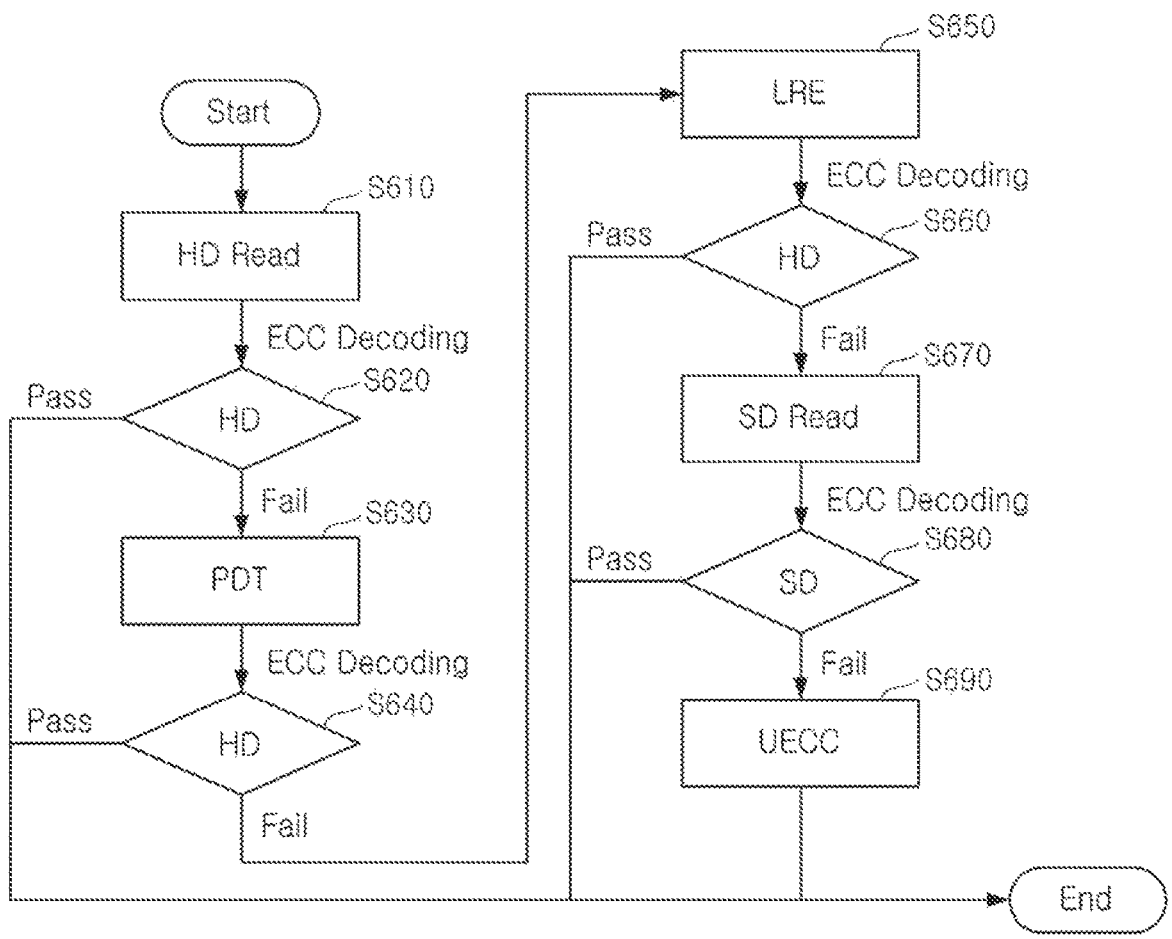
FIG. 6 is a diagram illustrating a defect code flow of a general storage device, according to an embodiment.

FIG. 6 is a diagram illustrating a process corresponding to a defect code flow of a general storage device.

A general storage device may recover an NVM error through a combination of an ECC operation and a read level searching algorithm. Referring to FIG. 6, according to a general defense code flow, at operation S610 HD read/decoding may be performed, and when the operation fails at operation S620, the HD decoding may be performed again at a new read level using a pre-defined table (PDT) at operation S630. The PDT defense code may store a read level value which may be recovered through profiling in advance for each situation in which an error may occur, and may attempt to recover swiftly using the values when an error occurs.

When the HD decoding fails at operation S640, an accurate valley finding algorithm such as least read estimation (LRE) may be used at operation S650, and if the HD decoding fails at operation S660, SD read/decoding may be performed at operation S670. The LRE defense code may search for an optimal read level by modeling cell distribution two-dimensionally or three-dimensionally using cell count information.

When the SD decoding fails at operation S680, correction may be attempted at operation S690 by changing a soft decision offset compared to a default of less read estimation (SDOT; soft decision offset tracking). Also, error recovery may be attempted by moving the read level searched in the less read estimation to the left/right (a swing defense code).

A general defense code flow may be performed according to a predetermined procedure, for example a fixed flow, regardless of what state an NVM is in. When the deterioration of the NVM is severe, frequency of performing the defense code flow may increase. Therefore, serious performance deterioration may be caused to the extent that a user may recognize the deterioration due to an increase in the defense code latency.

The storage device and the reading method thereof in an example embodiment may accurately monitor the state of the NVM and may change the defense code flow according to the situation in accordance with the monitoring result. As a result, the storage device and the reading method in the example embodiment may address the latency problem of the defense code flow.

Figure 7:
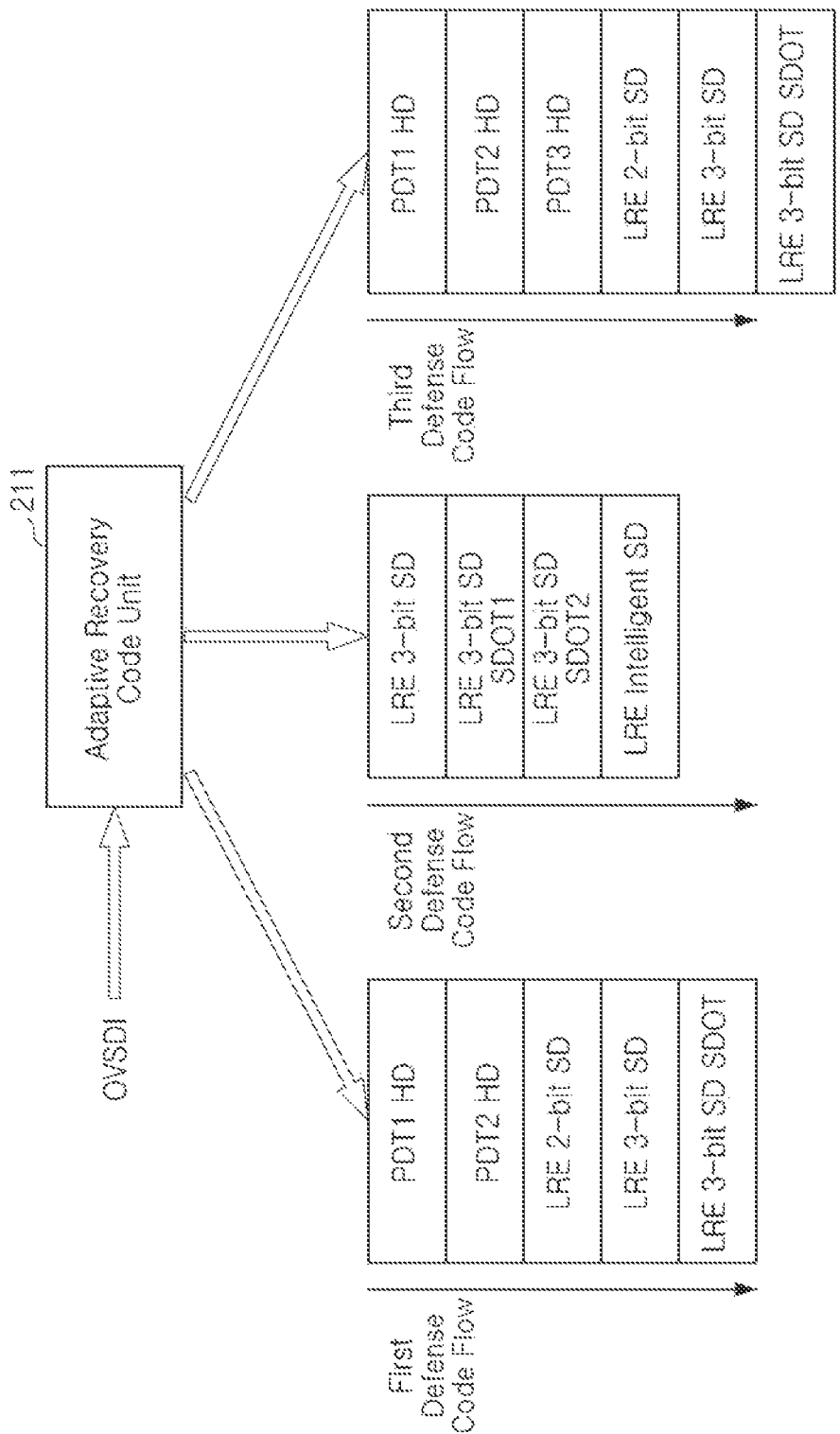
FIG. 7 is a diagram illustrating an adaptive defense code operation of a storage device according to an embodiment.

FIG. 7 is a diagram illustrating an adaptive defense code operation of a storage device according to an example embodiment. Referring to FIG. 7, an adaptive defense code unit 211 may select one of a plurality of defense code flows, or a defense code series, using detection information OVSDI, and a defense code operation may be performed according to the selected defense code flow. In FIG. 7, only three defense code flows are illustrated for ease of description, however embodiments are not limited thereto.

The storage device 10 in an example embodiment may predict distribution of an non-volatile memory device 100 using side information generated during a read operation of the non-volatile memory device 100, as shown for example in FIG. 1, may select an optimal defense code flow based on the predicted distribution, and may perform a defense code. In an example embodiment, the side information may include information about whether a valley search, or a search for an optimum valley, is successful according to an OVS operation or a height of the optimum valley.

When the non-volatile memory device 100 transfers the OVS information OVSDI to a controller 200, as shown for example in FIG. 1, in addition to read data, the controller 200 may select one of three defense code flows using the OVS information OVSDI and may perform the defense code.

First, when it is determined that the read data is normal, the defense code operation may be performed according to a basic defense code flow. In an example embodiment, the first defense code flow may perform in order a hard decision read operation by a first predefined table PDT1, a hard decision read operation by a second predefined table PDT2, a 2-bit soft decision read operation after performing a valley search by least read estimation (LRE), a 3-bit soft decision read operation after performing a valley search by LRE, and a 3-bit soft decision read operation and a SDOT read operation after a valley search by LRE.

Second, when it is determined that there are many errors in the read data, the defense code operation may be performed according to the defense code flow directly entering SD decoding instead of HD decoding. In an example embodiment, the second defense code flow may perform in order a 3-bit soft decision read operation after performing a valley search by LRE, a 3-bit soft decision read operation and a first SDOT read operation after performing a valley search by LRE, a 3-bit soft decision read operation and a second SDOT read operation after performing a valley search by LRE, and an intelligent soft decision read operation after performing a valley search by LRE.

Third, when it is determined that the read level needs to be changed, the defense code operation may performed according to the defense code flow requesting re-read to the NVM without decoding. In an example embodiment, the third defense code flow may include a hard decision read operation using a first predefined table PDT1, a hard decision read operation using a second predefined table PDT2, a hard decision read operation using a third predefined table PDT3, a 2-bit soft decision read operation after performing a valley search by least read estimation (LRE), a 3-bit soft decision read operation after performing a valley search by LRE, and a 3-bit soft decision read operation and a SDOT (a scanning method) read operation after performing a valley search by LRE. A 2-bit soft decision read operation may require 2-bit data for a read decision, and a 3-bit soft decision read operation may require 3-bit data for a read decision.

It should be understood that the number of the defense code flows and each defense code flow illustrated in FIG. 7 are merely examples.

Figure 8:
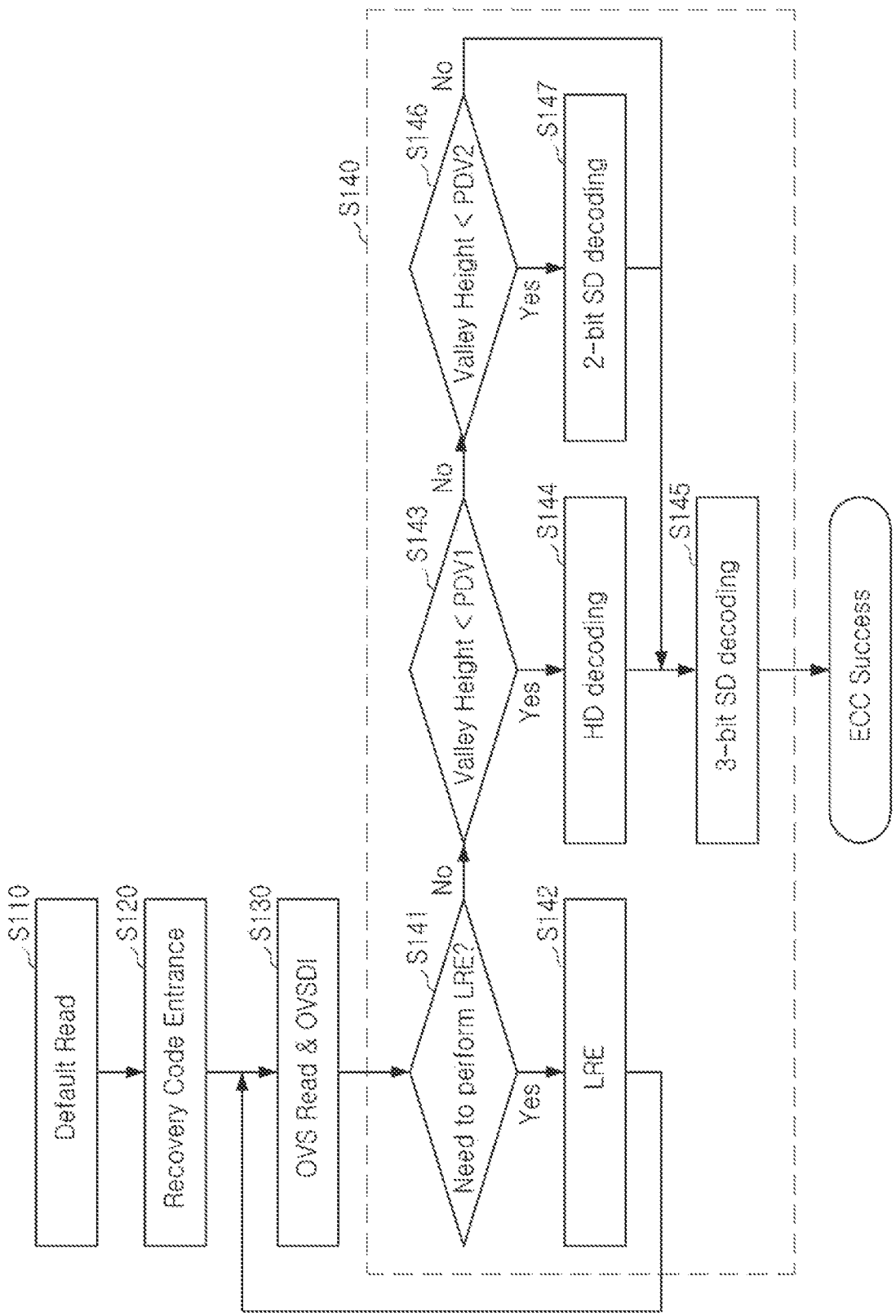
FIG. 8 is a flowchart illustrating an adaptive defense code of a storage device according to an embodiment.

FIG. 8 is a flowchart illustrating an adaptive defense code of a storage device according to an example embodiment. Referring to FIGS. 1 to 8, the adaptive defense code operation of the storage device 10 may be performed as follows.

The storage device 10 may perform a default read operation in response to an external host request, at operation S110. The default read operation may be a normal read operation or a history read operation. Default read may refer to performing HD decoding by reading at a default read level. When the decoding fails, for example when UECC is reached, or ECC decoding fails, the defense code may be performed, which represents a valley search through OVS sensing.

When it is determined that it is impossible to correct an error of the read data of the default read operation by the error correction circuit 230, as shown for example in FIG. 1, the storage device 10 may enter an adaptive defense code operation, at operation S120. The controller 200, as shown for example in FIG. 1 of the storage device 10 may transmit an OVS read command to the non-volatile memory device 100, as shown for example in FIG. 1, simultaneously when the storage device enters the defense code. The non-volatile memory device 100 may perform an OVS read operation in response to the OVS read command. The non-volatile memory device 100 may output data read in the OVD read operation and OVS detection information OVSDI to the controller 200, at operation S130.

The controller 200 may perform an adaptive ECC decoding operation using the OVS detection information OVSDI, at operation S140. In this case, read data and also OVS sensing data may be sent to the controller. Through this information, the controller may determine whether to perform ECC decoding on the respective data through internal calculation or to request re-read to the NAND as it is clear that the ECC cannot correct an error. In other words, when it is determined that LRE, a more powerful valley search algorithm is necessary, a valley search using LRE may be requested to the NAND, and as a method of the determination, a method of elaborately using the OVS data, or a method of using ECC syndrome weight may be considered. ECC syndrome may be a measure for estimating how much error occurred in read data using characteristics of the ECC code, and may be calculated through a computation within the ECC engine. As for weight, a syndrome may be a vector including 0,1 as elements, and weight may be the number of 1 herein, and it may be estimated that the greater the number, the more the errors may be.

The adaptive ECC decoding operation may be performed as follows. After operation S130, the controller 200 may determine whether it is necessary to search for an optimal valley through less read estimation (LRE), at operation S141. When the error correction is impossible and the number of errors is greater than a predetermined value, it may be determined that LRE is necessary, and LRE may be performed, at operation S142.

When LRE is not necessary, it may be determined whether a valley height extracted from the OVS detection information OVSDI is smaller than a first reference value PDV1, at operation S143. When the valley height is smaller than the first reference value PDV1, hard decision decoding may be performed using the changed read level, at operation S144. When the hard decision decoding is not passed thereafter, 3-bit soft decision decoding may be performed, at operation S145.

When the valley height is not less than the first reference value PDV1, it may be determined whether the valley height is less than a second reference value PDV2, at operation S146. The second reference value PDV2 may be higher than the first reference value PDV2. When the valley height is smaller than the second reference value PDV2, 2-bit soft decision decoding may be performed, at operation S147. When the 2-bit soft decision decoding is not passed or the valley height is not smaller than the second reference value PDV2 in operation S146, 3-bit soft decision decoding may be performed, at operation S145.

As illustrated in FIG. 8, a simple operation may be to operate without a feedback loop between the controller and the NAND. Once the NAND transfers the OVS information and read data, the controller may select only an ECC decoding mode without requesting an additional operation to the NAND, which may refer to a narrower operation than a representative operation.

As another example operation, optimal valley information provided by the NAND may be more specific or less specific than X and Y counts. A more specific case may be of when cell counts near the valley, such as X1, X2, Y1, and Y2, rather than X, Y count, may be transmitted more specifically. In this case, there may be a burden in data transfer, but the error level may be more accurately measured.

In embodiments, in the case of reading and transmitting only the X+Y count, the burden of data transfer may be reduced, and even through there is no information about the valley position, information about the error level may be predicted. When a valley is not to be changed, the defense code flow may be changed by simply knowing the error level, for example by simply selecting the decoding mode.

Figure 9:
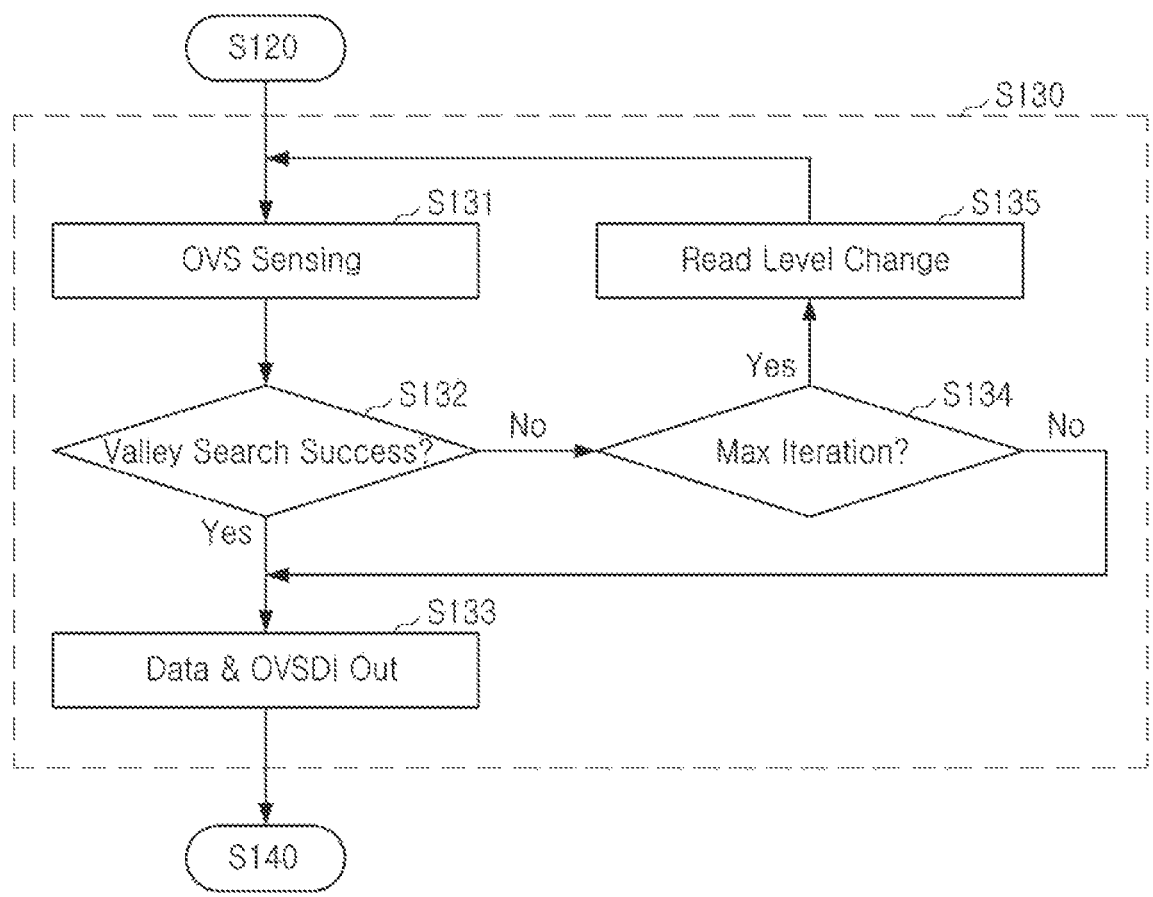
FIG. 9 is a flowchart illustrating operation S130 illustrated in FIG. 8, according to an embodiment.

FIG. 9 is a flowchart illustrating an example of operation S130 illustrated in FIG. 8. Referring to FIGS. 1 to 9, a process of outputting an OVS operation and OVS detection information OVSDI may be performed as follows.

The non-volatile memory device 100 receiving the OVS read command from the controller 200 may perform OVS sensing, at operation S131. The on-chip valley searching (OVS) may be an algorithm for swiftly reading distribution data near a valley and finding out which direction an optimal read level may be. The valley search method using the PDT method may be to choose randomly, such that the method may be less accurate, whereas the OVS may perform searching by predicting a distribution shape, such that it may be highly likely that an optimal read level may be searched. When the valley search is successful by this method, the data may be read in a state in which errors are reduced, and the data may be sent to the controller end.

In the OVS sensing operation, it may be determined whether the valley search is successful, at operation S132. When the valley search is successful, a data read operation may be performed using a read level corresponding to the searched valley, and OVS detection information OVSDI may be output accordingly, at operation S133.

When the valley search is unsuccessful, it may be determined whether the number of times the valley search is repeated is the maximum, at operation S134. When the number of repetitions is not the maximum value, the read level may be changed using the OVS sensing result, at operation S135, and operation S131 may be performed. When the number of repetitions is the maximum value, operation S133 may be performed.

Through the OVS operation, information about whether the read level is well matched, but an error level of when the valley is well matched may be obtained. Using this information, whether to perform read level search (LRE) may be determined.

Figure 10A:
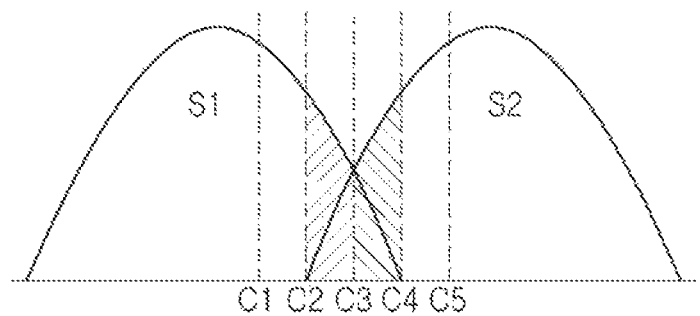
FIGS. 10A and 10B are diagrams illustrating an OVS read operation according to an embodiment.
Figure 10B:
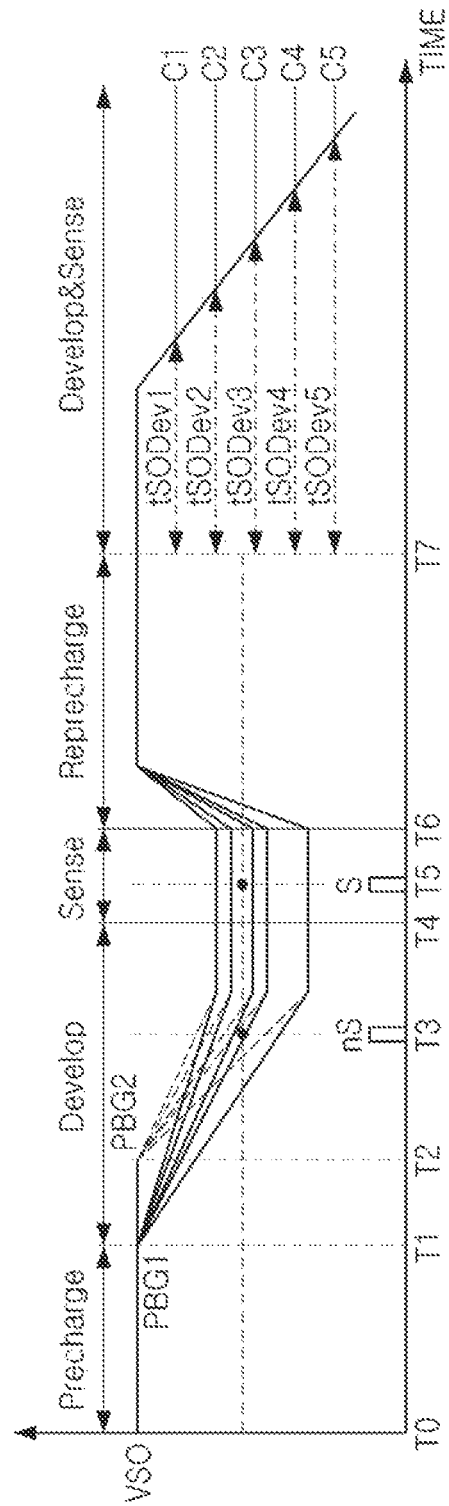

FIGS. 10A and 10B are diagrams illustrating an OVS read operation according to an example embodiment. As illustrated in FIG. 10A, the OVS operation for searching for distribution valleys of states S1 and S2 may be performed by a plurality of sensing operations. The plurality of sensing operations may be simultaneously performed in the plurality of page buffer groups, respectively.

Referring to FIG. 10B, an on-chip valley search operation may be performed by a method of storing a sensing result by sequentially latching sensing nodes at the same time points in different develop periods in first page buffers PGB1 and second page buffers PGB2.

The pre-charge operation may be performed from a time point T0 to a time point T1. For the pre-charging, a first bitline and a first sensing node connected to each of the first page buffers PBG1 may be charged. When the bitline set-up signals are activated, the sensing node and the first bitline may be pre-charged to a predetermined level. When the first bitline set-up signal is deactivated to a high level at the time point T1, a pre-charge circuit of each of the first page buffers PBG1 may be turned off. Also, when the second bitline set-up signal is deactivated to a high level at the time point T2 after the time point T1, the pre-charge circuit of each of the second page buffers PBG2 may be turned off. In this case, the level of the sensing node of each of the first page buffers PBG1 and the level of the sensing node of each of the second page buffers PBG2 may change according to a magnitude of a current flowing to a corresponding bitline according to whether the memory cell is turned on and off.

As illustrated in FIG. 10B, each of the first page buffers PBG1 may pre-charge a sensing node from a time point T0 to a time point T1, and may develop the first bitlines from a time point T1 to a time point T4. Each of the second page buffers PBG2 may pre-charge the sensing node from the time point T0 to the time point T1, and may develop the second bitlines from the time point T2, which may be later than the time point T1, to the time point T4. The first sensing operation may include a latch reset nS sensing operation performed at the time point T3 and a latch set S sensing operation at the time point T5. The first cell count information may be calculated using on-cell count values of the latch reset nS sensing operation and the latch set S sensing operation in the first page buffers PGB1. Also, the second cell count information may be calculated using the on-cell count values of the latch reset nS sensing operation and the latch set S sensing operation in the second page buffers PGB2. Based on the first and second cell count information of the first sensing operation, a detection case, for example one of C1 to C5, corresponding to an optimal read level corresponding to the distribution valley may be determined, and a develop time tS0Dev1-tS0Dev5 of the second sensing operation corresponding to the determined detection case may be determined.

FIGS. 11A to 11E are diagrams illustrating an adaptive defense code depending on a valley height of a storage device 10 according to an example embodiment.

Figure 11A:
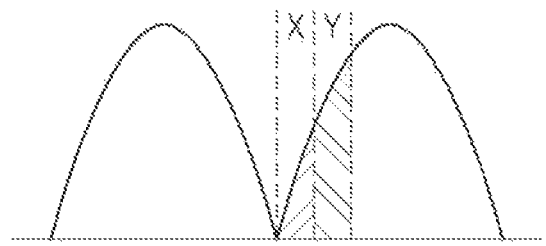
FIGS. 11A to 11E are diagrams illustrating an adaptive defense code depending on a valley height of a storage device 10 according to an embodiment.

FIG. 11A illustrates when a valley finding algorithm such as LRE may be used. Generally, the OVS information may be cell count information corresponding to normal X and Y. X may be a cell count value read below a predetermined level with reference to a target level, and Y may be a cell count value read above a predetermined level with reference to the target level.

In an example embodiment, when the X value and the Y value are greatly different from each other, the read level may not match well. Therefore, a new valley search operation may be necessary. When the valley may match well, the X and Y numbers may be quite similar. In this case, it may be worth performing ECC decoding.

Figure 11B:
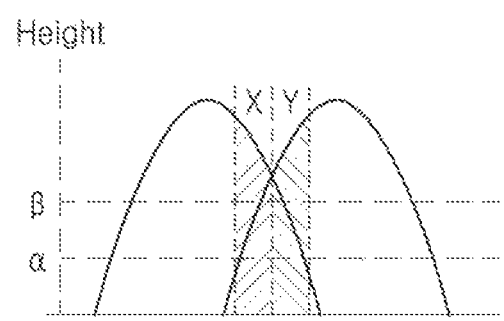

Referring to FIG. 11B, although a valley may be searched well, an ECC decoding method may be optimally selected according to the valley height compared to reference values $\alpha$ and $\beta$. For example, when a valley is well searched, the number of errors may be predicted through the counts of X and Y. When it is assumed that there are many errors in this prediction, it may be better to directly enter SD decoding rather than HD decoding. When it may not be corrected with HD decoding, it may not be necessary to waste time.

Figure 11C:
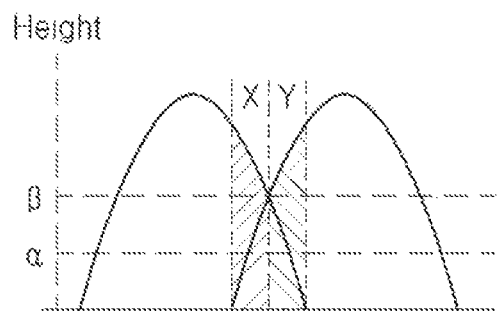
Figure 11D:
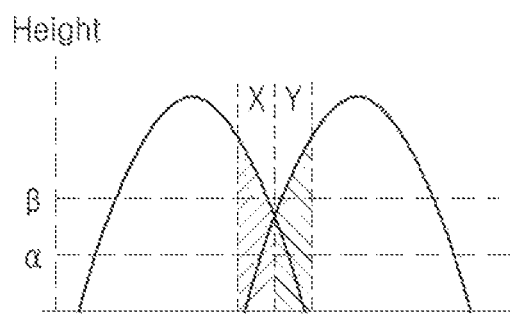
Figure 11E:
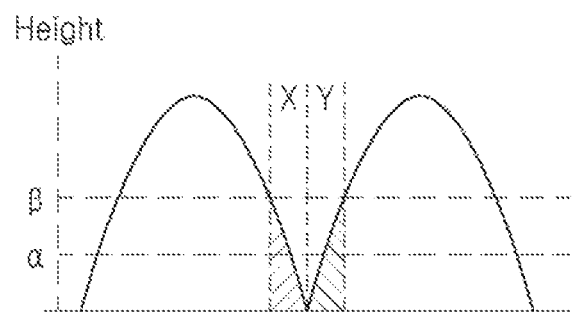

As illustrated in FIG. 11C, when the valley height is equal to or greater than the second reference values $\beta$, which may correspond to PDV2, 3-bit SD decoding may be performed immediately. As illustrated in FIG. 11D, when the valley height is equal to or greater than the first reference values $\alpha$, which may correspond to PDV1, and less than the second reference values $\beta$, which may correspond to PDV2, 2-bit SD decoding may be performed immediately. As illustrated in FIG. 11E, when the valley height is less than the first reference values $\alpha$, which may correspond to PDV1, HD decoding may be performed.

As described above, an adaptive ECC decoding method may reduce a defense code latency by removing inefficient operation of the defense code. Because a room to add another strong defense code using the reduced latency may be generated, a defense code flow with a stronger correction ability may be provided.

In particular, because the time occupied by the ECC decoding time in the defense code flow is long, it may be effective to exclude meaningless ECC decoding in terms of latency reduction.

Figure 12:
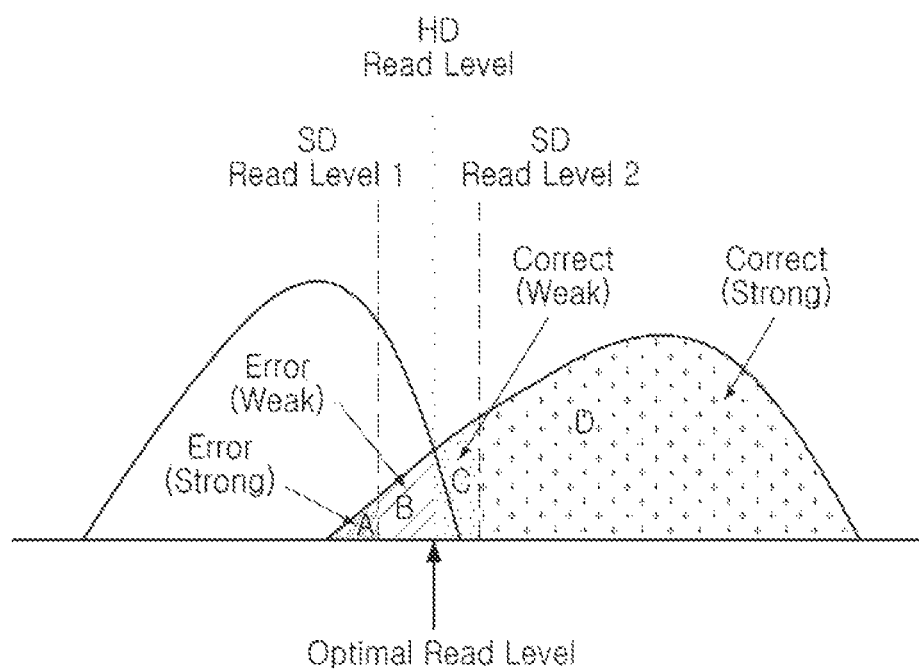
FIG. 12 is a diagram illustrating an example of selecting an ECC decoding mode of an adaptive defense code according to distribution according to an embodiment.

FIG. 12 is a diagram illustrating an example of selecting an ECC decoding mode of an adaptive defense code according to distribution according to an example embodiment. Referring to FIG. 12, a strong error area A, a weak error area B, a weak correction area C, and a strong correction area D may be present in an upper state.

In an example embodiment, the controller 200 may determine whether to perform HD decoding or whether to perform SD decoding using the OVS detection information OVSDI. The HD read operation may be an operation of reading data according to a turned-on state or a turned-off state of the memory cell by providing a predetermined hard decision read voltage to the memory cell. The SD read operation may be an operation of reading by providing a plurality of soft decision read voltages having a predetermined off-set difference based on the hard decision read voltage.

Also, a log likelihood ratio (LLR) may be a specific value provided to data used in a decoding process, and may be a value adding reliability to data. In other words, the LLR value may add reliability to the determination of whether the data is 0 or 1. In the example embodiment, reliability and the number of repetitions may be determined using the OVS detection information OVSDI. In an example embodiment, the controller 200 may determine an LLR value of the ECC decoding operation or the number of repetitions of the SD read operation according to the OVS detection information OVSDI.

FIGS. 1 to 11 illustrate adaptive defense code selection using OVS detection information OVSDI. It should be understood that embodiments are not limited to OVS detection information. The example embodiment may be described in terms of selectively operating ECC decoding using various pieces of side information in addition to the OVS detection information.

Figure 13:
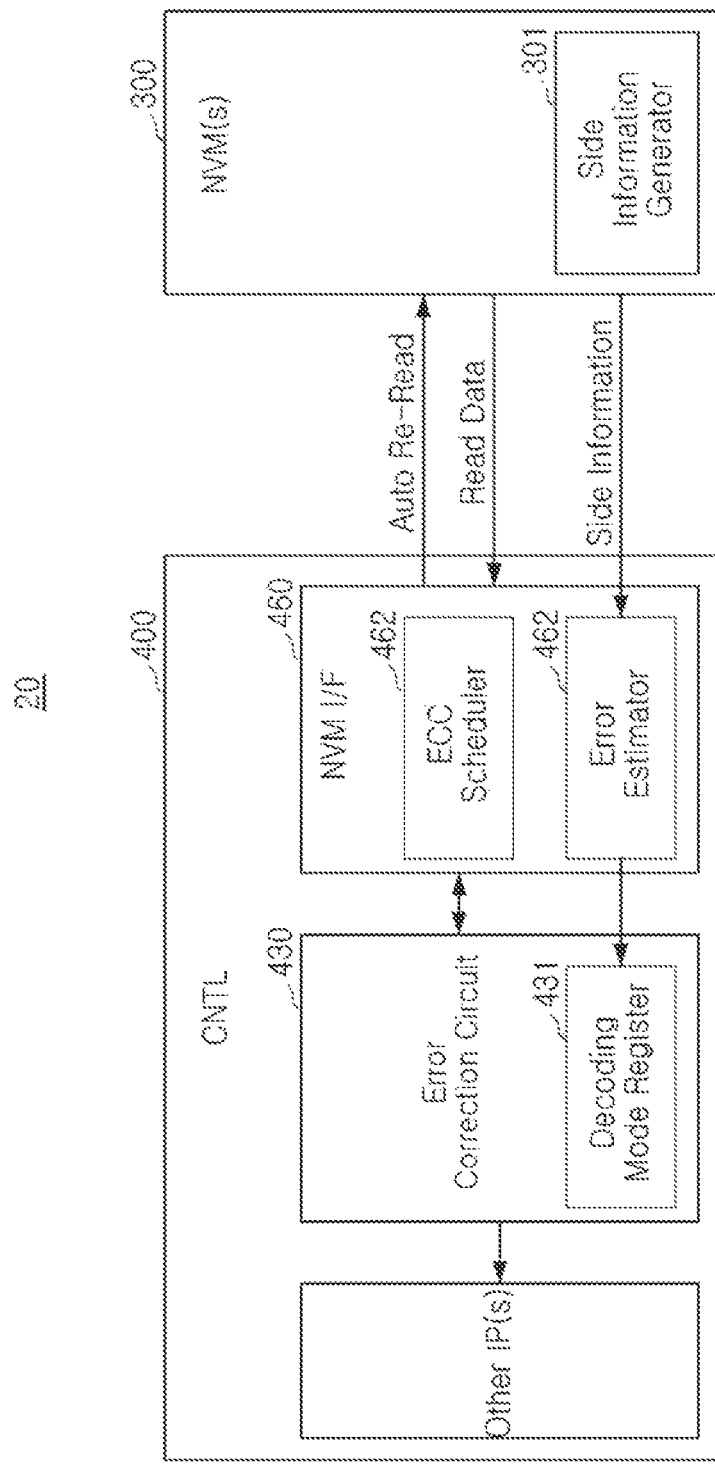
FIG. 13 is a diagram illustrating a storage device 20 according to an embodiment.

FIG. 13 is a diagram illustrating a storage device 20 according to an example embodiment. Referring to FIG. 13, a storage device 20 may include at least one non-volatile memory device 300 (NVM(s)) and a controller 400 (CNTL) for controlling the same.

The non-volatile memory device 300 may include a side information generator 301 for generating side information. In an example embodiment, the side information generator 301 may generate relevant side information by performing an OVS operation. In an example embodiment, the side information generator 301 may generate relevant side information by performing a cell count operation. In an example embodiment, the side information generator 301 may generate relevant side information by performing a read operation on a spare area of a page. Also, the non-volatile memory device 300 may output side information according to a periodic/aperiodic request from the controller 400. In an example embodiment, the side information may be transmitted through at least one line between the non-volatile memory device 300 and the controller 400. In another example embodiment, the side information may be transmitted through at least one data line between the non-volatile memory device 300 and the controller 400.

The controller 400 may include an error correction circuit 430, which may be for example an ECC circuit, and a non-volatile memory interface circuit 460 (NVM I/F).

The error correction circuit 430 may include a decoding mode register 431. The decoding mode register 431 may store optimal decoding mode information corresponding to side information transmitted from the non-volatile memory device 300. The decoding mode may include an HD decoding mode, a 1-bit SD decoding mode, a 2-bit SD decoding mode, and a 3-bit SD decoding mode.

The non-volatile memory interface circuit 460 may generate a command for controlling the non-volatile memory device 300. The non-volatile memory interface circuit 460 may include an error evaluator 461 and an ECC scheduler 462.

The error evaluator 461 may generate decoding mode information for determining a level of ECC decoding using the side information received from the non-volatile memory device 300.

The ECC scheduler 462 may control decoding of the error correction circuit 430 according to the side information received from the non-volatile memory device 300. For example, the ECC scheduler 462 may select an ECC level of ECC decoding based on the side information.

Figure 14:
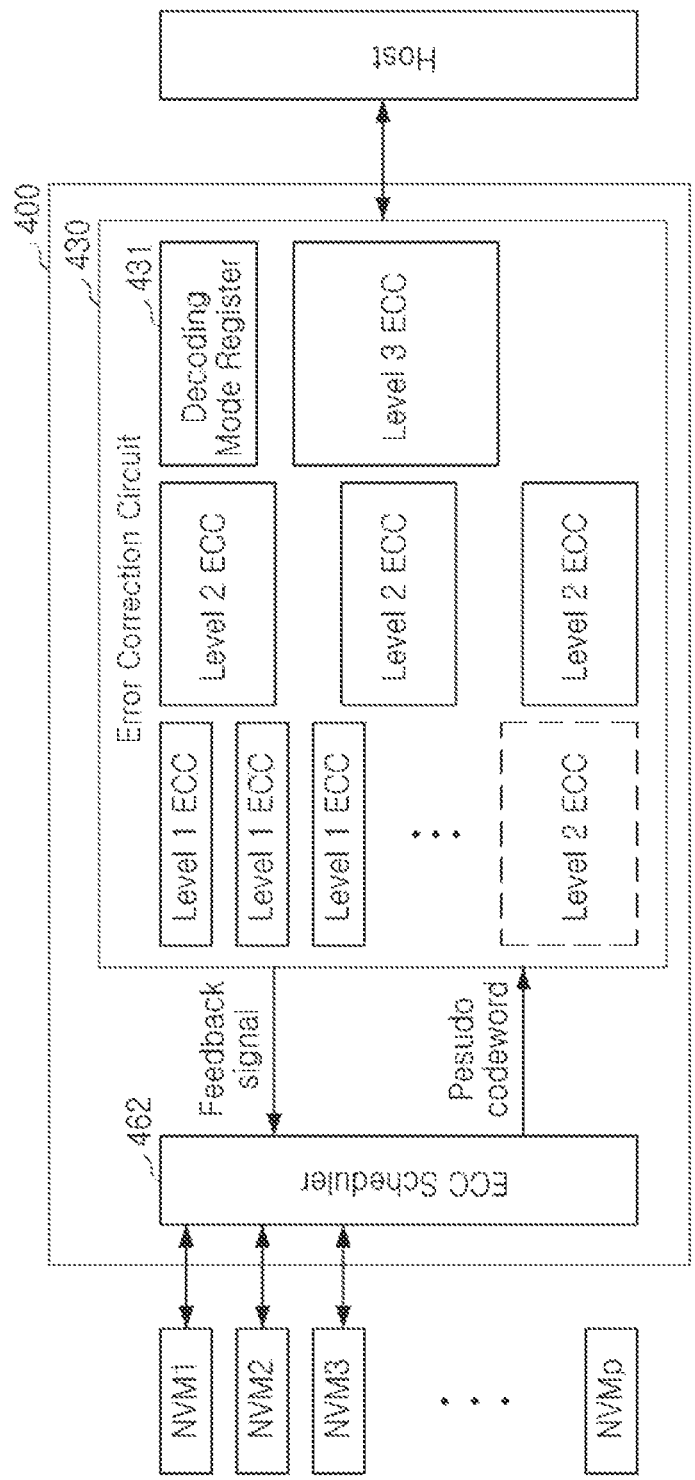
FIG. 14 is a diagram illustrating a controller 400 having an adaptive ECC scheduler 462 according to an embodiment.

FIG. 14 is a diagram illustrating a controller 400 having an adaptive ECC scheduler 462 according to an example embodiment.

Referring to FIG. 14, a plurality of non-volatile memory devices NVM1, NVM2, NVMp (where p is an integer equal to or greater than 2) may be connected to the ECC scheduler 462 and may transmit and receive data.

The ECC scheduler 462 may receive side information from each of a plurality of non-volatile memory devices NVM1, NVM2, NVMp, may select an optimal ECC decoding level corresponding to the side information, and may control the error correction circuit 430 to perform an ECC decoding operation according to the selected ECC decoding level. Also, the ECC scheduler 462 may transmit a pseudo codeword to the error correction circuit 430 and may receive a feedback signal from the error correction circuit 430.

The error correction circuit 430 may be implemented to perform a decoding operation according to a plurality of decoding levels. In FIG. 14, three decoding levels are illustrated for ease of description, but an example embodiment thereof is not limited thereto. The error correction circuit 430 may operate at an optimum decoding level according to the decoding mode information stored in the decoding mode register 431. The error-corrected data in the error correction circuit 430 may be transmitted to a host.

In FIG. 14, the level of ECC decoding may be determined according to a result of error evaluation of the non-volatile memory device. However, an example embodiment thereof is not limited thereto. The level of ECC decoding may be determined according to error evaluation of other memory devices in the controller.

Figure 15:
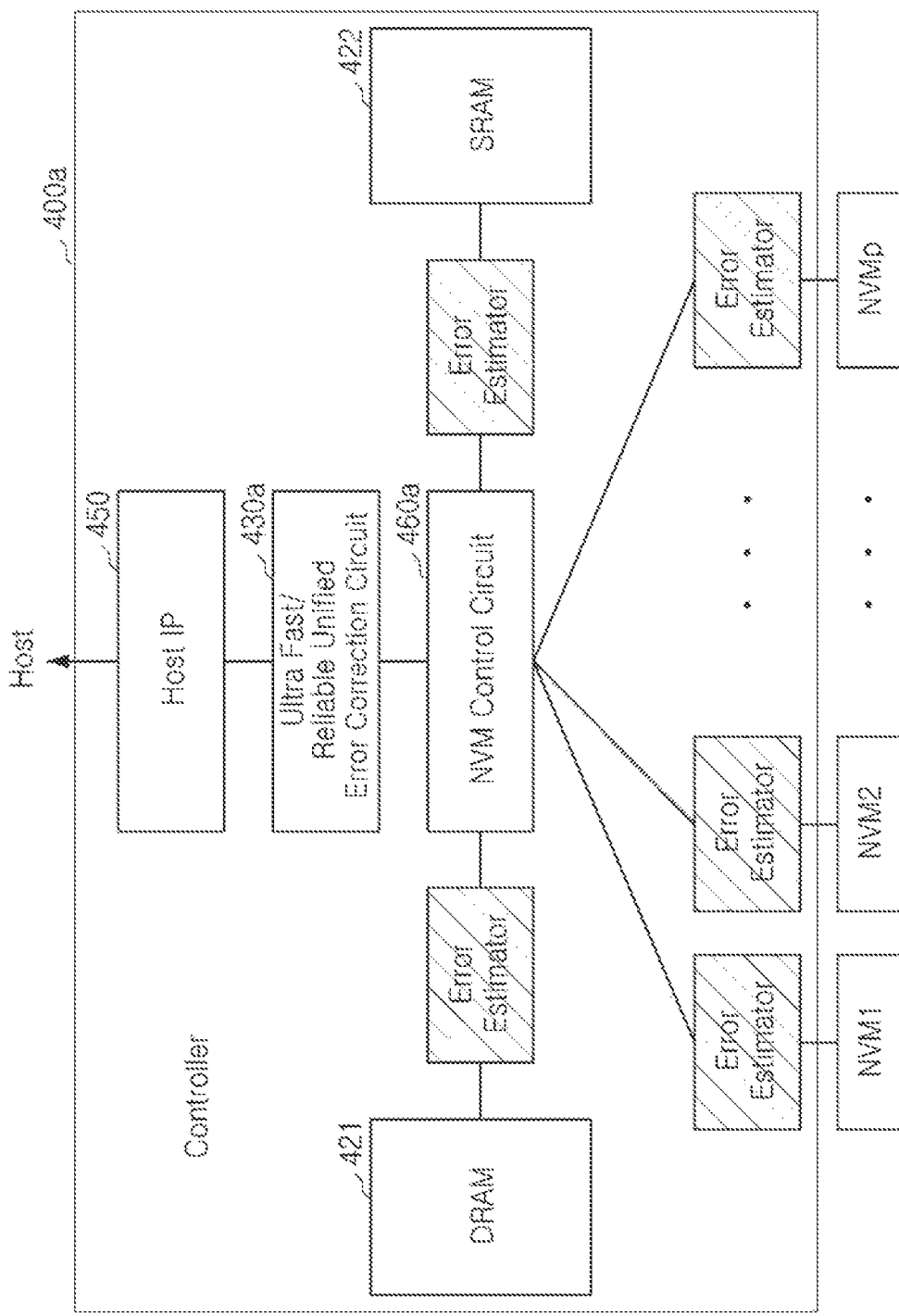
FIG. 15 is a diagram illustrating a controller according to another embodiment.

FIG. 15 is a diagram illustrating a controller according to another example embodiment. Referring to FIG. 15, an error correction circuit 430a may determine an optimal ECC decoding level using error evaluation of each of internal memories DRAM 421 and SRAM 422 or error evaluation of each of external non-volatile memory devices NVM1-NVMp. Accordingly, the error correction circuit 430a may perform an error correction operation which may be swift and highly reliable.

In an example embodiment, an error evaluator connected to each of the non-volatile memories NVM1-NVMp may be implemented in the same manner as the error evaluator 461 illustrated in FIG. 14. In an example embodiment, the error evaluator connected to each of the memory devices DRAM 421 and SRAM 422 may be implemented in the same manner as the error evaluator 461 illustrated in FIG. 13. In another example embodiment, the error evaluator connected to each of the memory devices DRAM 421 and SRAM 422 may be implemented differently from the error evaluator 461 illustrated in FIG. 13.

Figure 16:
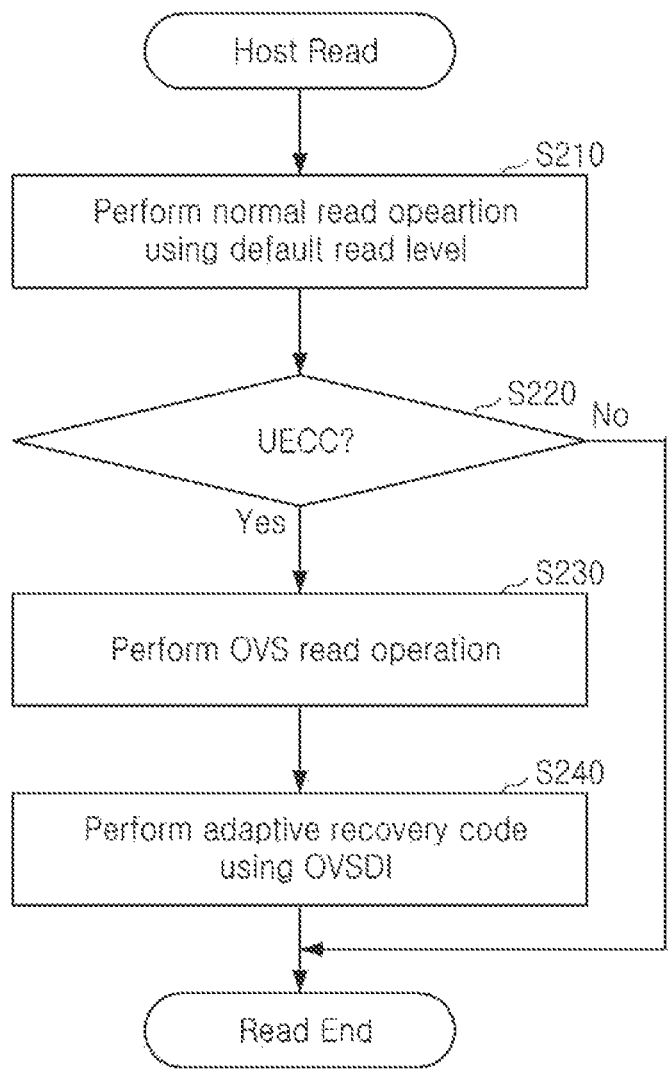
FIG. 16 is a flowchart illustrating a reading method of a storage device 10 according to an embodiment.

FIG. 16 is a flowchart illustrating a reading method of a storage device 10 according to an example embodiment. Referring to FIGS. 1 to 16, a read operation of the storage device 10 may be performed as follows.

The storage device 10, as shown for example in FIG. 1, may perform a normal read operation using a default read level in response to a read request from an external host, at operation S210. The non-volatile memory device 100, as shown for example in FIG. 1, of the storage device 10 may output read data according to a normal read operation to the controller 200, as shown for example in FIG. 1. The controller 200 may determine whether error correction of the read data is impossible, for example determining whether UECC is reached, using the error correction circuit 230, at operation S220.

When the error correction is impossible, the controller 200 may transmit an OVS read command to the non-volatile memory device 100, and the non-volatile memory device 100 may perform an OVS read operation in response to the OVS read command, at operation S230. Read data and the OVS detection information OVSDI according to the OVS read operation may be output to the controller 200. When error correction of the read data according to the OVS read operation is impossible, the controller 200 may perform the adaptive defense code using the OVS detection information OVSDI, at operation S240.

Figure 17:
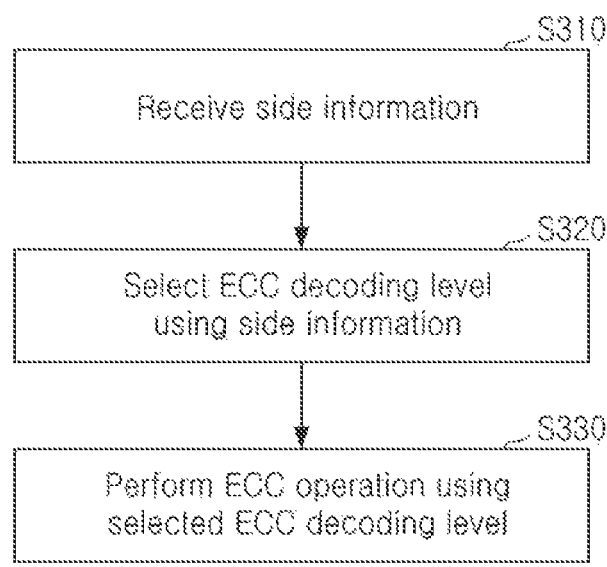
FIG. 17 is a diagram illustrating a reading method of a storage device according to another embodiment.

FIG. 17 is a diagram illustrating a reading method of a storage device according to another example embodiment.

Referring to FIGS. 1 to 17, a read operation of the storage device 20, as shown for example in FIG. 13, may be performed as follows.

The controller 400, as shown for example in FIG. 13, may receive side information from the non-volatile memory device 300, as shown for example in FIG. 13, at operation S310. The side information may be related to cell distribution characteristics of the non-volatile memory device 300. For example, the side information may include cell count information, valley search detection information, and the like.

The controller 400 may select the ECC decoding level using the side information, at operation S320. The controller 400 may perform an ECC decoding operation according to the selected ECC decoding level, at operation S330.

Figure 18:
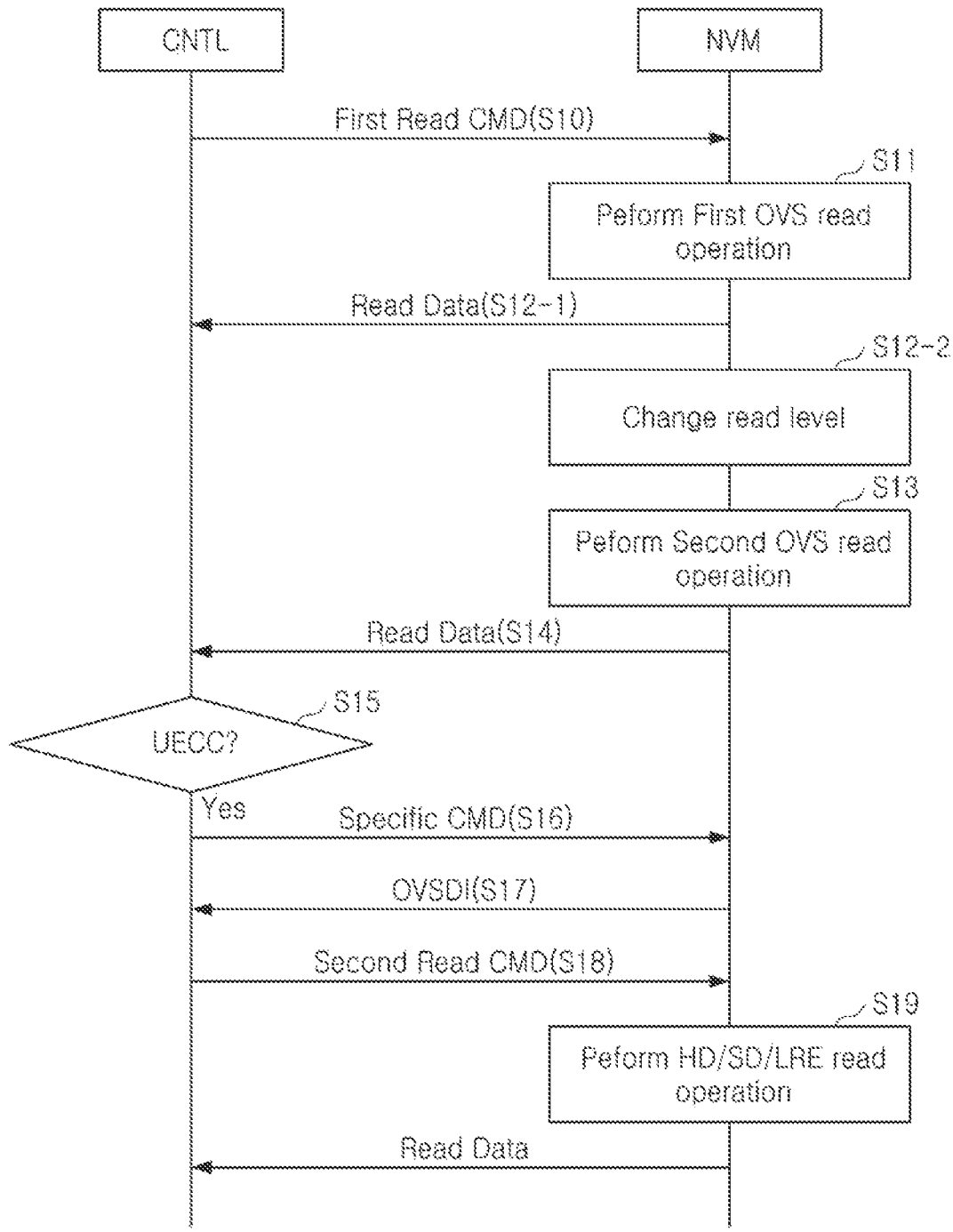
FIG. 18 is a ladder diagram illustrating an adaptive defense code process of a storage device according to another embodiment.

FIG. 18 is a ladder diagram illustrating an adaptive defense code process of a storage device according to another example embodiment. Referring to FIGS. 1 to 18, a defense code process of the storage device may be performed as follows.

The controller CNTL, which may for example correspond to controller 200 or controller 400, may transmit a first read command to the non-volatile memory device NVM, which may for example correspond to non-volatile memory device 100, at operation S10. The non-volatile memory device NVM may perform a first OVS read operation in response to the first read command, at operation S11. When the valley search is successful, read data for the first OVS read operation may be output to the controller CNTL, at operation S12-1. When the valley search is unsuccessful, the non-volatile memory device NVM may change the read level, at operation S12-2, and may perform a second OVS read operation using the changed read level, at operation S13. Read data for the second OVS read operation may be output to the controller CNTL, at operation S14.

Thereafter, the controller CNTL may determine whether error correction for the read data is impossible, at operation S15. When error correction is impossible, the controller CNTL may transmit a specific command to the non-volatile memory device NVM, at operation S16. The non-volatile memory device NVM may transmit the OVS detection information OVSDI to the controller CNTL in response to a specific command, at operation S17. Thereafter, the controller CNTL may perform an adaptive defense code using the OVS detection information OVSDI. The controller CNTL may select and perform an optimal defense code using the OVS detection information OVSDI. The controller CNTL may transmit a second read command corresponding to the optimal defense code to the non-volatile memory device NVM. The second read command may include a read command corresponding to one of a hard decision read operation, a soft decision read operation, and an LRE (valley search) read operation, at operation S18. The non-volatile memory device NVM may perform a hard decision read/soft decision read/LRE read operation in response to the second read command, at operation S19. Read data of the read operation may be output to the controller CNTL.

In an example embodiment, the at least one OVS read operation may include a first OVS read operation, and when an optimal valley is not searched in the first OVS read operation, the control logic may change the read level and may perform the second OVS read operation. In an example embodiment, at least one OVS read operation may include a first OVS read operation, and when a detection case of the first OVS read operation is an edge case, the control logic may change a read level and may perform the second OVS read operation. In an example embodiment, the control logic may receive a second read command corresponding to the detection information, and may perform at least one of a hard decision read operation, a soft decision read operation, and a valley search read operation in response to the second read command. In an example embodiment, sizes of the first sector data and the second sector data output in response to the second read command may be different from each other.

Figure 19:
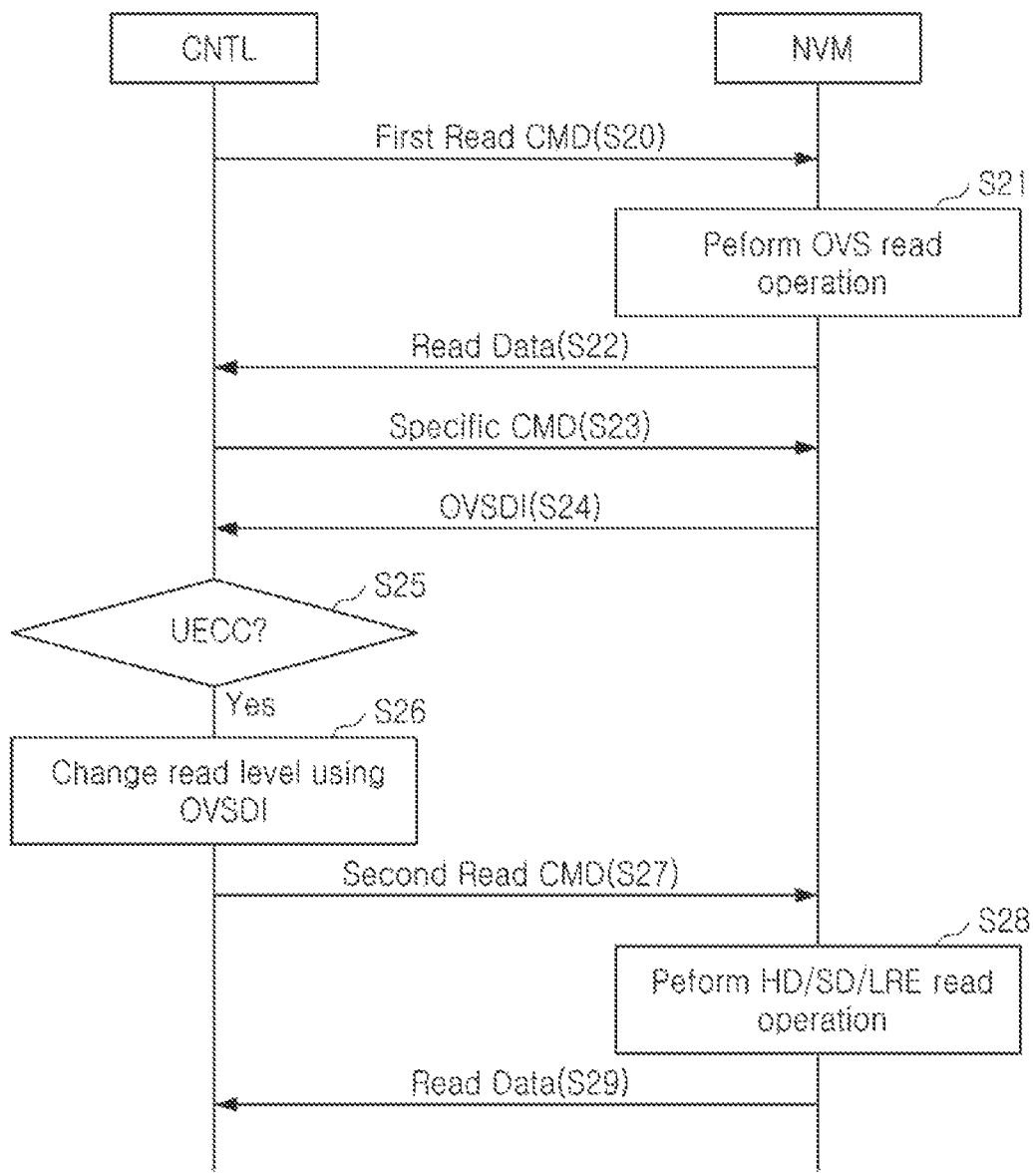
FIG. 19 is a ladder diagram illustrating an adaptive defense code process of a storage device 10 according to another embodiment.

FIG. 19 is a ladder diagram illustrating an adaptive defense code process of a storage device, which may correspond to storage device 10, according to another example embodiment. Referring to FIGS. 1 to 19, the defense code process of the storage device 10 may be performed as follows.

The controller CNTL may transmit the first read command to the non-volatile memory device NVM, at operation S20. The non-volatile memory device NVM may perform an OVS read operation in response to the first read command, at operation S21. Read data for the OVS read operation may be output to the controller CNTL, at operation S22. The controller CNTL may transmit a specific command to the non-volatile memory device NVM, at operation S23. The non-volatile memory device NVM may transmit OVS detection information OVSDI to the controller CNTL in response to a specific command, at operation S24.

The controller CNTL may determine whether it is impossible to correct an error of the read data of the OVS read operation, at operation S25. When error correction is impossible, the controller CNTL may change the read level using the OVS detection information OVSDI, at operation S26.

Thereafter, the controller CNTL may transmit the second read command to the non-volatile memory device NVM together with the changed read level. The second read command may include a read command corresponding to one of a hard decision read operation, a soft decision read operation, and a valley search read operation such as an LRE (valley search) read operation, at operation S27. The non-volatile memory device NVM may perform a hard decision read/soft decision read/LRE read operation in response to the second read command, at operation S28. Read data of the read operation may be output to the controller CNTL, at operation S29.

Figure 20:
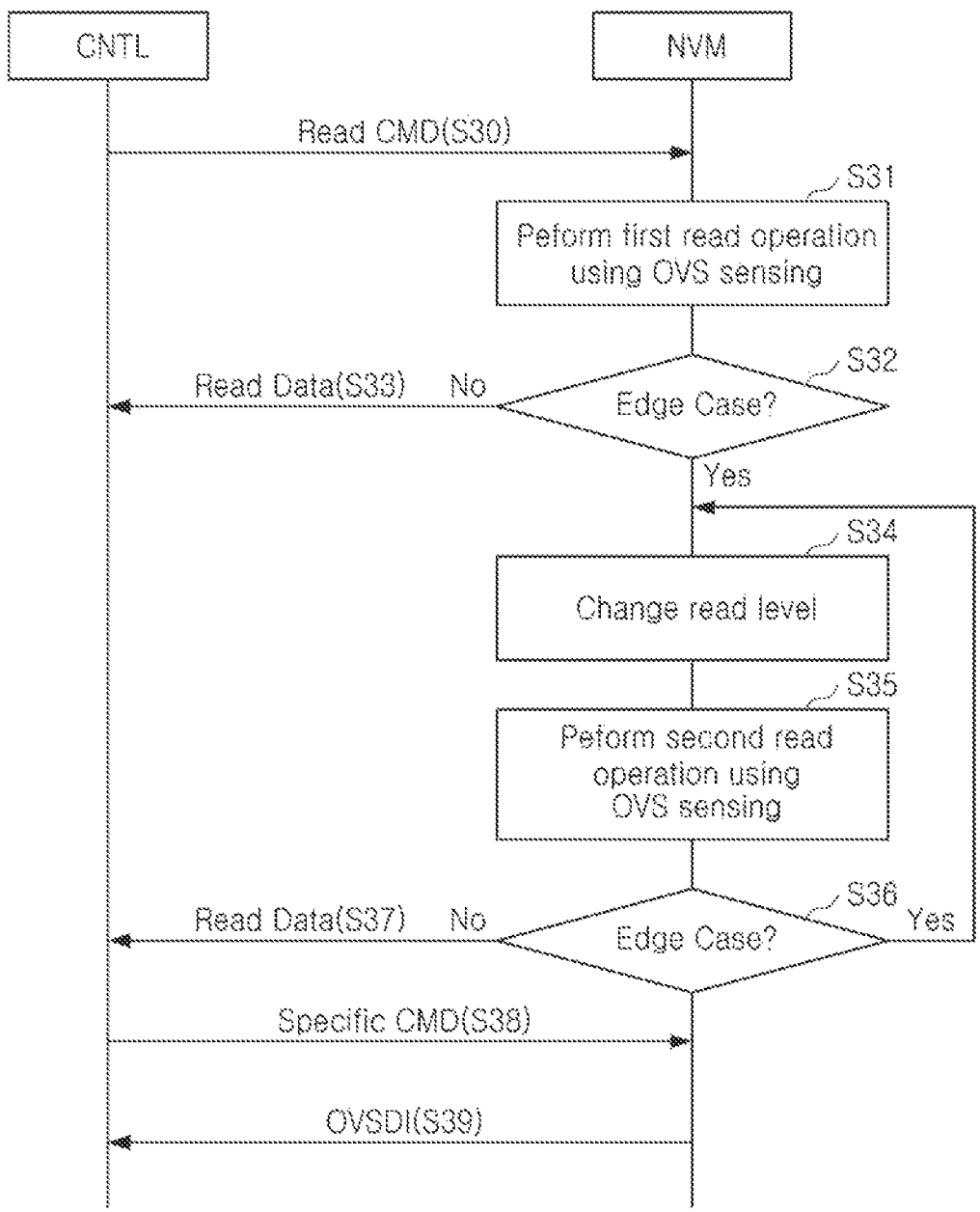
FIG. 20 is a ladder diagram illustrating an adaptive defense code process of a storage device 10 according to another embodiment.

FIG. 20 is a ladder diagram illustrating an adaptive defense code process of a storage device which may correspond to storage device 10 according to another example embodiment. Referring to FIGS. 1 to 20, a defense code process of the storage device may be performed as follows.

The controller CNTL may transmit a read command to the non-volatile memory device NVM, at operation S30. The non-volatile memory device NVM may perform a first read operation using OVS sensing in response to a read command, at operation S31.

It may be determined whether a detection case of the first read operation, at operation S32, is an edge. When the detection case is not an edge, read data of the second read operation may be output to the controller CNTL, at operation S33. When the detection case is an edge, the non-volatile memory device NVM may change a read level, at operation S34. The non-volatile memory device NVM may perform a second read operation using OVS sensing based on the internally changed read level, at operation S35.

Thereafter, it may be determined whether the detection case of the second read operation is an edge, at operation S36. When the detection case of the second read operation is not an edge, read data of the second read operation may be output to the controller CNTL, at operation S37. When the detection case of the second read operation is an edge, operation S34 may be performed.

Thereafter, the controller CNTL may transmit a specific command to the non-volatile memory device NVM, at operation S38. The non-volatile memory device NVM may transmit the OVS detection information OVSDI to the controller CNTL in response to the specific command, at operation S39.

Figure 21:
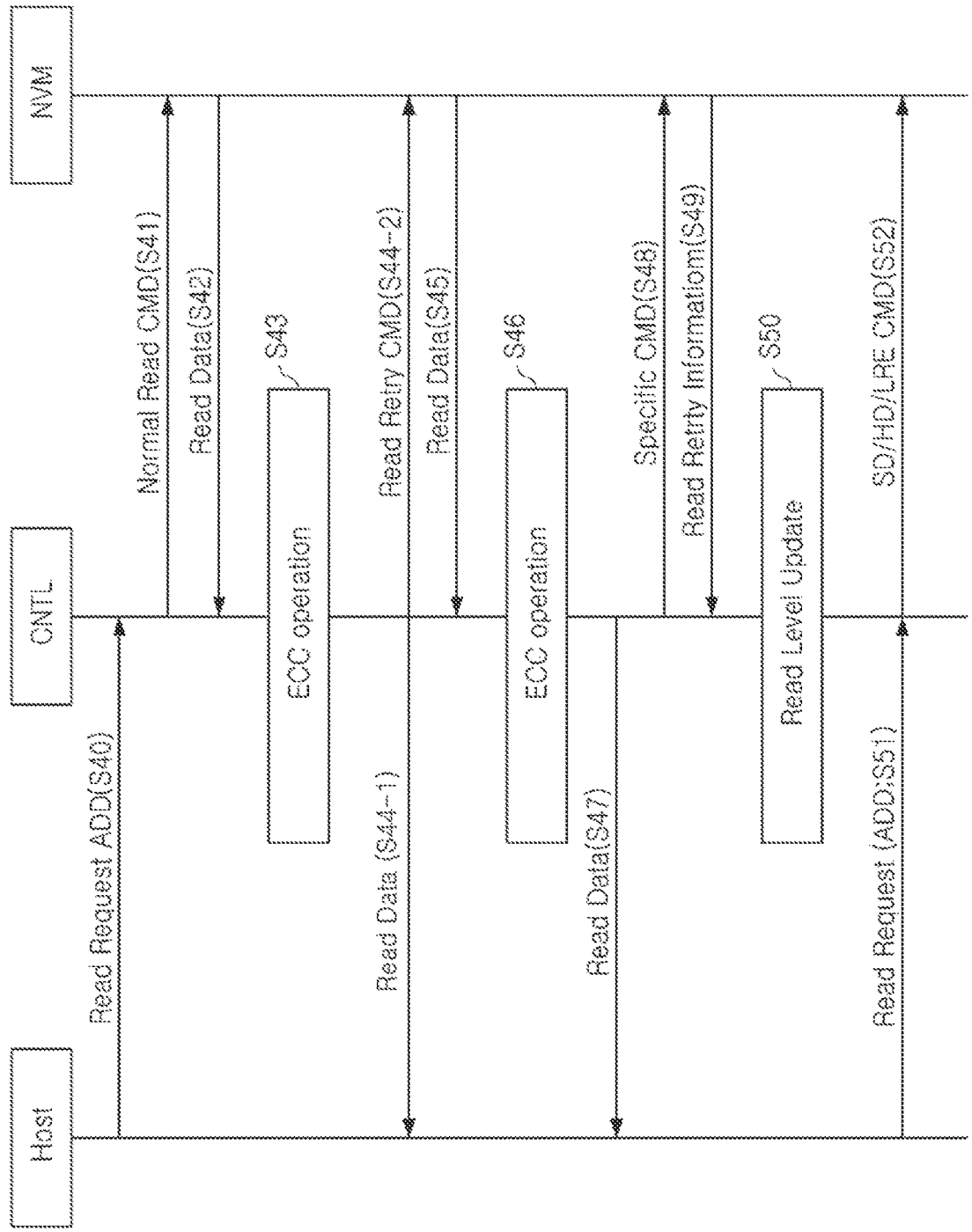
FIG. 21 is a ladder diagram illustrating a read operation of a storage device 10 according to another embodiment.

FIG. 21 is a ladder diagram illustrating a read operation of a storage device, which may correspond to storage device 10, according to another example embodiment. Referring to FIGS. 1 to 21, a read operation of the storage device may be performed as follows.

A host may transmit a read request to the storage device 10 together with an address ADD, as shown for example in FIG. 1, at operation S40. The controller CNTL, which may correspond to controller 200 of the storage device 10, may receive the read request, may search for a history buffer, may determine whether to perform a history read operation or a normal read operation, and may transmit a normal/history read command corresponding to the determined operation to the non-volatile memory device NVM, for example non-volatile memory device 100 as shown in FIG. 1, at operation S41. The non-volatile memory device NVM may perform a read operation in response to a normal/history read command and may transmit data read accordingly to the controller 200, at operation S42.

Thereafter, the controller CNTL may perform an error correction operation on the data read by the error correction circuit 230, at operation S43. When there is no error or the error is correctable, read data or corrected data may be transmitted to the host, at operation S44-1.

When error correction is not possible, the controller CNTL may transmit a read retry command to the non-volatile memory device NVM, at operation S44-2. The non-volatile memory device NVM may perform a read operation using OVS sensing in response to such a read retry command and may transmit the read data to the controller 200, at operation S45.

Thereafter, the controller CNTL may perform an error correction operation on the data read from the error correction circuit 230 again, at operation S46. When there is no error or error correction is possible, read data or corrected data may be transmitted to the host, at operation S47. Thereafter, the controller CNTL may transmit a specific command to the non-volatile memory device NVM to obtain read retry information having read level information, at operation S48. The non-volatile memory device NVM may output read retry information in response to the specific command, at operation S49. Thereafter, the controller CNTL may finally update a history read level table HRT using the read retry information, at operation S50.

Thereafter, when a read request for the same address ADD is received from the host, at operation S51, the storage device 10 may transmit an optimal read command, for example an SD/HD/LRE read command, to the non-volatile memory device NVM using the OVS detection information OVSDI, at operation S52.

The storage device in an example embodiment may include an artificial intelligence processor dedicated to the defense code.

Figure 22:
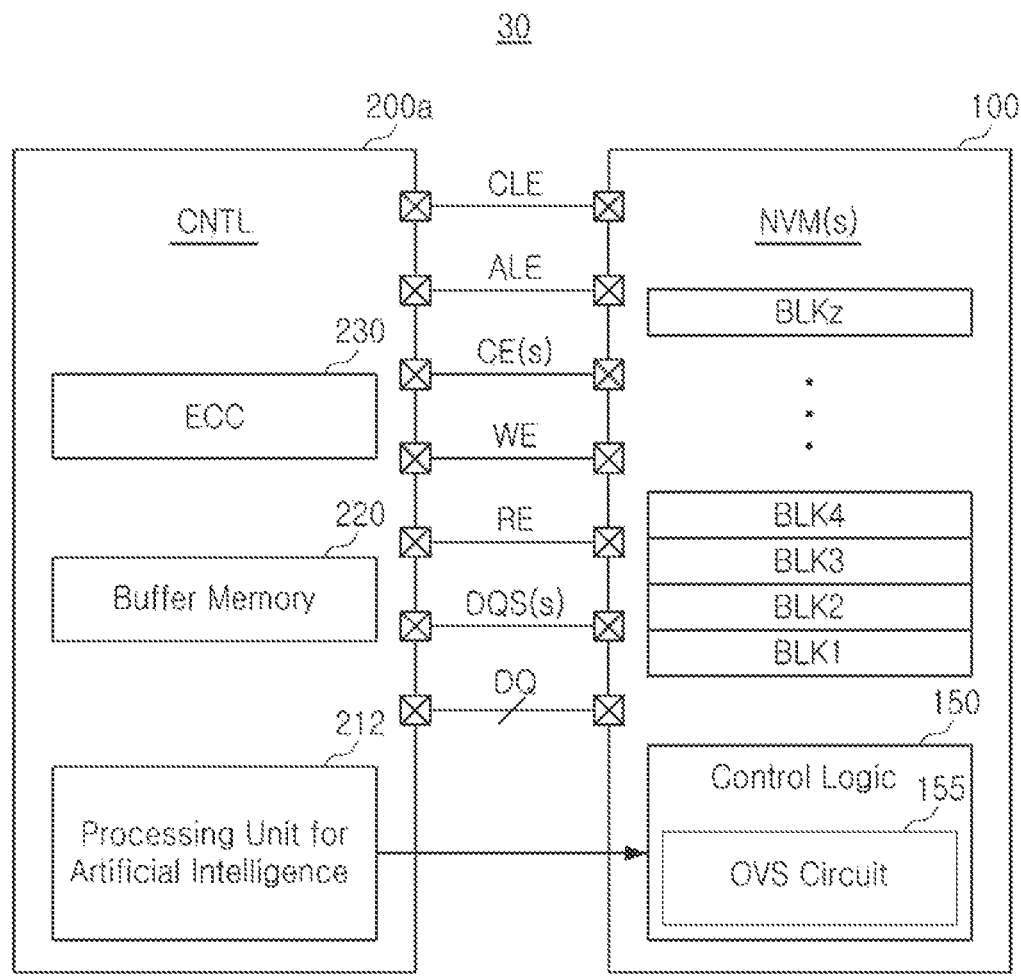
FIG. 22 is a diagram illustrating a storage device 30 according to another embodiment.

FIG. 22 is a diagram illustrating a storage device 30 according to another example embodiment. Referring to FIG. 22, a controller 200a of a storage device 30 may include an artificial intelligence processor 212 for executing an adaptive defense code unit as compared to the example illustrated in FIG. 1. The artificial intelligence processor 212 may perform machine learning to manage reliability of the non-volatile memory device 100.

The non-volatile memory device in an example embodiment may be implemented in a chip to chip (C2C) structure.

Figure 23:
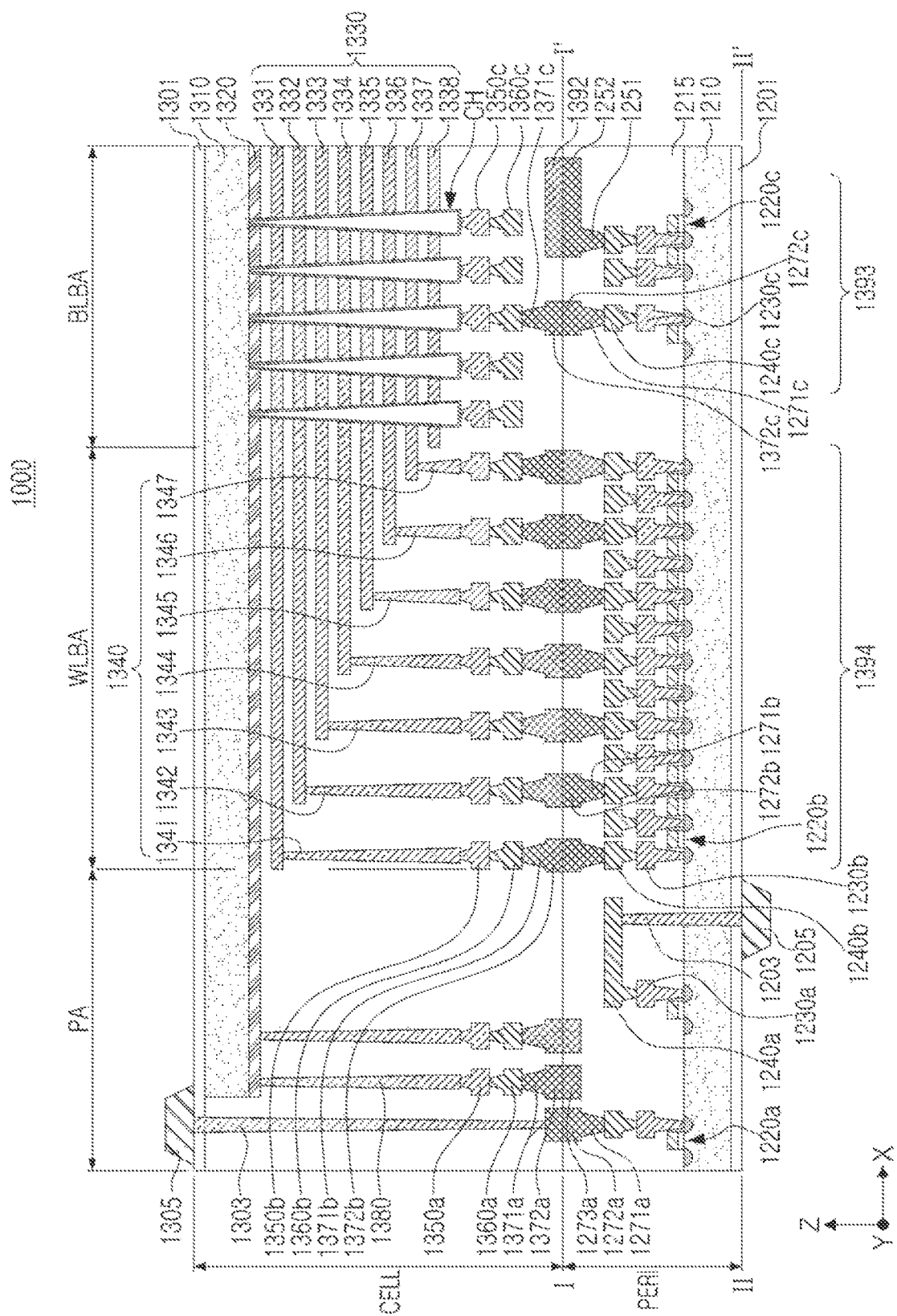
FIG. 23 is a diagram illustrating a non-volatile memory device 1000 implemented in a C2C structure according to another embodiment.

FIG. 23 is a diagram illustrating a non-volatile memory device 1000 implemented in a C2C structure according to another example embodiment. In the C2C structure, an upper chip including a cell area CELL may be manufactured on a first wafer, a lower chip including a peripheral circuit area PERI may be manufactured on a second wafer different from the first wafer, and the upper chip and the lower chip may be connected to to each other by a bonding method. For example, the bonding method may be a method of of electrically connecting a bonding metal formed on an uppermost metal layer of an upper chip to a bonding metal formed on an uppermost metal layer of a lower chip. In an example embodiment, when the bonding metal is formed of copper (Cu), the bonding method may be a Cu-to-Cu bonding method. In another example embodiment, the bonding metal may be formed of aluminum (Al) or tungsten (W).

Each of the peripheral circuit area PERI and the cell area CELL of the non-volatile memory device 1000 may include an external pad bonding area PA, a wordline bonding area WLBA, and a bitline bonding area BLBA.

The peripheral circuit area PERI may include a first substrate 1210, an interlayer insulating layer 1215, a plurality of circuit devices 1220a, 1220b, and 1220c formed on the first substrate 1210, and a plurality of circuit devices 1220a, 1220b, and 1220c, first metal layers 1230a, 1230b, and 1230c connected to each of the plurality of circuit devices 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having a relatively high resistivity. In an example embodiment, the second metal layers 1240a, 1240b, and 1240c may be formed of copper having a relatively low resistivity.

FIG. 23 illustrates the first metal layers 1230a, 1230b, and 1230c and the second metal layers 1240a, 1240b, and 1240c, but an example embodiment thereof is not limited thereto. At least one metal layer may be further formed on the second metal layers 1240a, 1240b, and 1240c. At least a portion of the one or more metal layers formed on the second metal layers 1240a, 1240b, and 1240c may be formed of aluminum having resistivity different from that of copper forming the second metal layers 1240a, 1240b, and 1240c.

In an example embodiment, the interlayer insulating layer 1215 may be disposed on the first substrate 1210 to cover the plurality of circuit devices 1220a, 1220b, and 1220c, the first metal layers 1230a, 1230b, and 1230c, and the second metal layers 1240a, 1240b, and 1240c. In an example embodiment, the interlayer insulating layer 1215 may include an insulating material such as silicon oxide or silicon nitride.

Lower bonding metals 1271b and 1272b may be formed on the second metal layer 1240b of the wordline bonding area WLBA. In the wordline bonding area WLBA, the lower bonding metals 1271b and 1272b of the peripheral circuit area PERI may be electrically connected to the upper bonding metals 1371b and 1372b of the cell area CELL by a bonding method. In an example embodiment, the lower bonding metals 1271b and 1272b and the upper bonding metals 1371b and 1372b may be formed of aluminum, copper, or tungsten. Also, the upper bonding metals 1371b and 1372b of the cell area CELL may be referred to as first metal pads, and the lower bonding metals 1271b and 1272b may be referred to as second metal pads.

The cell area CELL may include at least one memory block. In an example embodiment, the cell area CELL may include the second substrate 1310 and the common source line 1320. A plurality of wordlines 1330, which may include wordline 1331 through wordline 1338, may be stacked on the second substrate 1310 in a direction (for example a Z-axis direction) perpendicular to an upper surface of the second substrate 1310. In an example embodiment, string selection lines and ground selection lines may be disposed on and below the wordlines 1330. In an example embodiment, a plurality of wordlines 1330 may be disposed between the string selection lines and the ground selection line.

In the bitline bonding area BLBA, the channel structure CH may extend in a direction (for example the Z-axis direction) perpendicular to an upper surface of the second substrate 1310 and may penetrate wordlines 1330 and string selection lines, and ground selection lines. The channel structure CH may include a data storage layer, a channel layer, and a buried insulating layer, and the channel layer may be electrically connected to the first metal layer 1350*c* and the second metal layer 1360*c*. For example, the first metal layer 1350*c* may be a bitline contact, and the second metal layer 1360*c* may be a bitline. In an example embodiment, the second metal layer 1360*c* may extend in a first direction (for example a Y-axis direction) parallel to the upper surface of the second substrate 1310.

As illustrated in FIG. 23, an area in which the channel structure CH and the second metal layer 1360*c* are disposed may be referred to as a bitline bonding area BLBA. In an example embodiment, the second metal layer 1360*c* may be electrically connected to the circuit devices 1220*c* providing a page buffer 1393 in the peripheral circuit area PERI in the bitline bonding area BLBA. For example, the second metal layer 1360*c* may be connected to the upper bonding metals 1371*c* and 1372*c* in the peripheral circuit area PERI. The upper bonding metals 1371*c* and 1372*c* may be connected to the lower bonding metals 1271*c* and 1272*c* connected to the circuit devices 1220*c* of the page buffer 1393. In the wordline bonding area WLBA, the wordlines 1330 may extend in a second direction (for example an X-axis direction) perpendicular to the first direction and parallel to the upper surface of the second substrate 1310. In an example embodiment, the wordline bonding area WLBA may be connected to the plurality of cell contact plugs 1340, which may include for example cell contact plug 1341 through cell contact plug 1347. For example, the wordlines 1330 and the cell contact plugs 1340 may be connected to each other by pads provided by at least a portion of the wordlines 1330 extending by different lengths in the second direction. In an example embodiment, the first metal layer 1350*b* and the second metal layer 1360*b* may be connected in order to the cell contact plugs 1340 connected to the wordlines 1330. In an example embodiment, the cell contact plugs 1340 may be connected to the peripheral circuit area PERI through the upper bonding metals 1371*b* and 1372*b* of the cell area CELL and the lower bonding metals 1271*b* and 1272*b* of the peripheral circuit area PERI in the wordline bonding area WLBA.

In an example embodiment, the cell contact plugs 1340 may be electrically connected to the circuit devices 1220*b* providing the row decoder 1394 in the peripheral circuit area PERI. In an example embodiment, operating voltages of the circuit devices 1220*b* providing the row decoder 1394 may be different from operating voltages of the circuit devices 1220*c* providing the page buffer 1393. For example, operating voltages of the circuit devices 1220*c* providing the page buffer 1393 may be greater than operating voltages of the circuit devices 1220*b* providing the row decoder 1394.

A common source line contact plug 1380 may be disposed in the external pad bonding area PA. In an example embodiment, the common source line contact plug 1380 may be formed of a conductive material such as a metal, a metal compound, or polysilicon. The common source line contact plug 1380 may be electrically connected to the common source line 1320. A first metal layer 1350*a* and a second metal layer 1360*a* may be stacked in order on the common source line contact plug 1380. For example, an area in which the common source line contact plug 1380, the first metal layer 1350*a*, and the second metal layer 1360*a* are disposed may be referred to as an external pad bonding area PA. The second metal layer 1360*a* may be electrically connected to the upper metal via 1371*a*. The upper metal via 1371*a* may be electrically connected to the upper metal pattern 1372*a*.

Input/output pads 1205 and 1305 may be disposed in the external pad bonding area PA. Referring to FIG. 23, a lower insulating layer 1201 covering a lower surface of the first substrate 1210 may be formed below the first substrate 1210. Also, a first input/output pad 1205 may be formed on the lower insulating layer 1201. In an example embodiment, the first input/output pad 1205 may be connected to at least one of a plurality of circuit devices 1220*a*, 1220*b*, and 1220*c* disposed in the peripheral circuit area PERI through the first input/output contact plug 1203. In an example embodiment, the first input/output pad 1205 may be separated from the first substrate 1210 by the lower insulating layer 1201. Also, because a side insulating layer is disposed between the first input/output contact plug 1203 and the first substrate 1210, the first input/output contact plug 1203 and the first substrate 1210 may be electrically separated from each other.

Referring to FIG. 23, an upper insulating layer 1301 covering an upper surface of the second substrate 1310 may be formed on the second substrate 1310. Also, a second input/output pad 1305 may be disposed on the upper insulating layer 1301. In an example embodiment, the second input/output pad 1305 may be connected to at least one of the plurality of circuit devices 1220*a*, 1220*b*, and 1220*c* disposed in the peripheral circuit area PERI through the second input/output contact plug 1303, the lower metal pattern 1272*a*, and the lower metal via 1271*a*.

In an example embodiment, the second substrate 1310 and the common source line 1320 may not be disposed in an area in which the second input/output contact plug 1303 is disposed. Also, the second input/output pad 1305 may not overlap the wordlines 1330 in the third direction (for example the Z-axis direction). Referring to FIG. 23, the second input/output contact plug 1303 may be separated from the second substrate 1310 in a direction parallel to the upper surface of the second substrate 1310. Also, the second input/output contact plug 1303 may penetrate the interlayer insulating layer 1315 of the cell area CELL and may be connected to the second input/output pad 1305. In an example embodiment, the second input/output pad 1305 may be electrically connected to the circuit device 1220*a*.

In an example embodiment, the first input/output pad 1205 and the second input/output pad 1305 may be selectively formed. For example, the non-volatile memory device 1000 may include only a first input/output pad 1205 disposed on the first substrate 1210 or a second input/output pad 1305 disposed on the second substrate 1310. In another example embodiment, the non-volatile memory device 1000 may include both a first input/output pad 1205 and a second input/output pad 1305.

A metal pattern of an uppermost metal layer may be present as a dummy pattern in each of the external pad bonding area PA and the bitline bonding area BLBA included in the cell area CELL and the peripheral circuit area PERI, respectively, or the uppermost metal layer may be empty.

The non-volatile memory device 1000 in an example embodiment may form a lower metal pattern 1273a having the same shape as that of the upper metal pattern 1372a of the cell area CELL on the uppermost metal layer of the peripheral circuit area PERI to correspond to the upper metal pattern 1372a formed on the uppermost metal layer of the cell area CELL in the external pad bonding area PA. The lower metal pattern 1273a formed on the uppermost metal layer of the peripheral circuit area PERI may not be connected to a contact in the peripheral circuit area PERI. Similarly, an upper metal pattern having the same shape as that of the lower metal pattern of the peripheral circuit area PERI on an upper metal layer of the cell area CELL to correspond to the lower metal pattern formed on the uppermost metal layer of the peripheral circuit area PERI in an external pad ponding area PA.

A storage device and a reading method thereof in an example embodiment may reduce an ECC decoder of a controller and latency of a defense code.

The storage device and an operating method in an example embodiment may store side information of an internal valley searching algorithm and may transmit the information to the controller when a read is performed in the NAND. In an example embodiment, the controller may determine the ECC and a defense code mode based on the corresponding side information and may feedback the corresponding information to the NAND.

In an example embodiment, after an ECC fails as NAND errors increase, operation may be performed with an optimal recovery defense code, such that unnecessary recovery defense code modes may be omitted, and overall recovery latency may be reduced.

A general defense code technique may predict only a level of an error and may determine the ECC operation mode based on the prediction. The defense code technique in the example embodiment may estimate accuracy of a current read level as well as an error level using side information about an internal operation of the NAND, such that estimated accuracy may be used for the ECC operation and the defense code operation. A general defense code technique may simply determine which ECC operation is to be performed, but the defense code technique in example embodiments may determine an overall recovery defense code mode.

According to the aforementioned example embodiments, the non-volatile memory device, the controller for controlling the same, the storage device having the same, and the reading method thereof may, by selecting an optimal defenase code, selecting an optimal defense code flow, or selecting an optimal error correction decoding level using the side information, reduce defense code latency.

While the example embodiments have been illustrated and described above, it will be apparent to those skilled in the art that modifications and variations could be made without departing from the scope of the present disclosure as defined by the appended claims.

What is claimed is:

1. A non-volatile memory device, comprising:
a plurality of memory blocks including at least two strings between respective bitlines and a common source line, wherein each string of the at least two strings includes at least one string selection transistor, a plurality of memory cells, and at least one ground transistor connected in series between a bitline of the bitlines and the common source line, wherein a gate of the at least one string selection transistor is connected to a string selection line, wherein each memory cell of the plurality of memory cells is configured to receive a wordline voltage from a corresponding wordline, and wherein a gate of the at least one ground transistor is connected to a ground selection line; and
a control logic configured to perform at least one on-chip valley search (OVS) read operation with respect to memory cells connected to a wordline of a memory block selected from among the plurality of memory blocks based on a first read command, and to output detection information of the at least one OVS read operation to an external device based on a specific command,
wherein the detection information includes information about whether a search for an optimal valley is successful, or about a height value of the optimal valley.

2. The non-volatile memory device of claim 1, wherein the at least one OVS read operation includes a first OVS read operation, and
wherein, based on the optimal valley not being detected in the first OVS read operation, the control logic is further configured to change a read level and perform a second OVS read operation according to the changed read level.

3. The non-volatile memory device of claim 1, wherein the at least one OVS read operation includes a first OVS read operation, and
wherein, based on a detection case of the first OVS read operation being an edge case, the control logic is further configured to change a read level and perform a second OVS read operation according to the changed read level.

4. The non-volatile memory device of claim 1, wherein the control logic is further configured to receive a second read command corresponding to the detection information, and perform at least one of a hard decision read operation, a soft decision read operation, and a valley search read operation based on the second read command.

5. The non-volatile memory device of claim 4, wherein a size of first sector data is different from a size of second sector data output in response to the second read command.

6. A storage device, comprising:
at least one non-volatile memory device; and
a controller configured to control the at least one non-volatile memory device, and including:
control pins configured to provide control signals to the at least one non-volatile memory device;
a buffer memory configured to store tables for executing a plurality of defense codes;
an error correction circuit configured to correct an error of first read data of a first page read from the at least one non-volatile memory device based on a first read command; and
at least one processor configured to drive a defense code management unit based on an error of the first read data being uncorrectable, wherein the defense code management unit is configured to:
receive side information from the at least one non-volatile memory device through at least one control pin of the control pins, and
select a defense code of the plurality of defense codes, or a defense code flow from among a plurality of defense code flows, based on the side information.

7. The storage device of claim 6, wherein the side information includes information related to an on-chip valley search (OVS) read operation.

8. The storage device of claim 6, wherein the error correction circuit operates at different error correction decoding levels according to the side information.

9. The storage device of claim 6, wherein the controller is further configured to predict distribution of a memory cell by receiving the side information.

10. The storage device of claim 9, wherein the controller is further configured to select one of hard decision decoding, 2-bit soft decision decoding, and 3-bit soft decision decoding according to a result of the predicting.

11. A reading method of a storage device, the reading method comprising:
performing a normal read operation based on a default read level;
determining whether data read in the normal read operation is error-correctable;
performing an on-chip valley search (OVS) read operation based on determining that the read data is not error-correctable; and
performing an adaptive defense code according to detection information of the OVS read operation based on a result of the OVS read operation being a read-failure,
wherein the adaptive defense code corresponds to one of a hard decision read operation, a soft decision read operation, and a valley search read operation according to the detection information.

12. The reading method of claim 11, further comprising:
changing a read level based on the result of the OVS read operation being the read-failure.

13. The reading method of claim 11, further comprising:
determining an error correction decoding level based on the side information; and
correcting an error of data read according to the error correction decoding level.

14. The reading method of claim 11, further comprising:
issuing an auto re-read command based on the result of the OVS read operation being the read-failure.

15. A non-volatile memory device, comprising:
a memory cell area having a first metal pad;
a peripheral circuit area having a second metal pad and being vertically connected through the first metal pad and the second metal pad;
a memory cell array including a plurality of memory blocks having a plurality of memory cells connected to a plurality of wordlines and a plurality of bitlines in the memory cell area;
a row decoder configured to select one of the plurality of wordlines in the peripheral circuit area;
a page buffer circuit having a plurality of page buffers connected to the plurality of bitlines in the peripheral circuit area; and
a control logic configured to receive a command latch enable (CLE) signal, an address latch enable (ALE) signal, a chip enable signal, a write enable (WE) signal, a read enable signal, and a data strobe signal through control pins, and to perform an on-chip valley search (OVS) read operation by latching a command or an address on an edge of the WE signal in response to the CLE signal and the ALE signal, in the peripheral circuit area,
wherein the control logic is configured to output detection information of the OVS read operation to an external device based on a specific command, and
wherein the detection information includes information about whether a search for an optimal valley is successful, or about a valley height value of the optimal valley.

16. A method of controlling a storage device, the method comprising:
performing a read operation to obtain read data;
detecting an error in the read data;
determining whether the error in the read data is correctable;
based on determining that the error in the read data is not correctable, performing an on-chip valley search (OVS) read operation;
obtaining detection information corresponding to the OVS read operation;
selecting a data recovery procedure from among a plurality of data recovery procedures based on the detection information; and
performing the selected data recovery procedure.

17. The method of claim 16, wherein the selected data recovery procedure includes at least one from among a hard decision read operation, a soft decision read operation, and a valley search read operation.

* * * * *